United States Patent
Yamamoto et al.

(10) Patent No.: US 6,525,680 B2
(45) Date of Patent: *Feb. 25, 2003

(54) DECODER AND DECODING METHOD

(75) Inventors: Kouhei Yamamoto, Tokyo (JP); Toshiyuki Miyauchi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/876,701

(22) Filed: Jun. 7, 2001

(65) Prior Publication Data

US 2002/0035716 A1 Mar. 21, 2002

(30) Foreign Application Priority Data

Jun. 8, 2000 (JP) ........................... 2000-172677

(51) Int. Cl.7 ........................... H03M 7/00; H03M 13/00
(52) U.S. Cl. ................. 341/107; 714/746; 714/786; 714/758
(58) Field of Search .................. 341/107, 50, 51; 714/758, 799, 793, 760, 794, 780, 752, 777, 746, 786, 795, 796; 375/341

(56) References Cited

U.S. PATENT DOCUMENTS

| | | | | | |
|---|---|---|---|---|---|
| 4,328,582 A | * | 5/1982 | Battail et al. | ................ | 714/780 |
| 4,742,533 A | * | 5/1988 | Weidner et al. | ............. | 714/786 |
| 5,862,190 A | * | 1/1999 | Schaffner | ..................... | 714/794 |
| 5,930,272 A | * | 7/1999 | Thesling | ..................... | 375/341 |
| 5,933,462 A | * | 8/1999 | Viterbi et al. | ............... | 714/796 |
| 6,028,899 A | * | 2/2000 | Petersen | ..................... | 375/341 |
| 6,167,552 A | * | 12/2000 | Gagnon et al. | ............. | 375/341 |
| 6,360,345 B1 | * | 3/2002 | Kim et al. | ................... | 714/746 |

* cited by examiner

*Primary Examiner*—Peguy JeanPierre
*Assistant Examiner*—Jean Bruner JeanGlaude
(74) *Attorney, Agent, or Firm*—Frommer Lawrence & Haug LLP; William S. Frommer; Dennis M. Smid

(57) ABSTRACT

A decoder has a reduced circuit dimension that does not adversely affect the decoding performance of the circuit. The decoder includes an addition/comparison/selection circuit added to give the log likelihood and adapted to compute a correction item expressed in a one-dimensional function relative to a variable and add a predetermined value to the correction term in order to provide a unified symbol for identifying the positiveness or negativeness of the log likelihood for the purpose of computing the log likelihood.

22 Claims, 14 Drawing Sheets

DECODER AND DECODING METHOD

BACKGROUND OF THE INVENTION

1. Field of the Invention

This invention relates to a decoder and a decoding method adapted to soft-output decoding.

2. Related Background Art

There have been many studies in recent years for minimizing symbol error rates by obtaining soft-outputs for the decoded outputs of inner codes of concatenated codes or the outputs of recursive decoding operations using a recursive decoding method. There have also been studies for developing decoding methods that are adapted to producing soft-outputs. For example, Bahl, Cocke, Jelinek and Raviv, "Optimal decoding of linear codes for minimizing symbol error rates", IEEE Trans. Inf. Theory, Vol. It-20, PP. 284–287, March 1974 describes an algorithm for minimizing symbol error rates when decoding predetermined codes such as convolutional codes. The algorithm will be referred to as BCJR algorithm hereinafter. The BCJR algorithm is designed to output not each symbol but the likelihood of each symbol as a result of decoding operation. Such an outputs is referred to as soft-output. The BCJR algorithm will be discussed below firstly by referring to FIG. 1. Assume that digital information is put into convolutional codes by encoder 201 of a transmitter (not shown), whose output is then input to a receiver (not shown) by way of a memoryless channel 202 having noises and decoded by decoder 203 of the receiver for observation.

The M states (transitional states) representing the contents of the shift registers of the encoder 201 are denoted by integer m (m=0, 1, . . . , M-1) and the state at time t is denoted by $S_t$. If information of k bits is input in a time slot, the input at time t is expressed by $i_t=(i_{t1}, i_{t2}, \ldots, i_{tk})$ and the input system is expressed by $I_1^T=(i_1, i_2, \ldots, i_T)$. If there is a transition from state m' to state m, the information bits corresponding to the transition are expressed by i (m', m)=($i_1$ (m', m), $i_2$ (m', m), . . . , $i_k$ (m', m)). Additionally, if a code of n bits is output in a time slot, the output at time t is expressed by $x_t=(x_{t1}, x_{t2}, \ldots, x_{tn})$ and the output system is expressed by $X_1^T=(x_1, x_2, \ldots, x_T)$. If there is a transition from state m' to state m, the information bits corresponding to the transition are expressed by x (m', m)=($x_1$ (m', m), $x_2$ (m', m), . . . , $x_k$ (m', m)).

The encoder 201 starts to produce convolutional codes at state $S_0=0$ and ends at state $S_T=0$ after outputting $X_1^T$. The inter-state transition probabilities $P_t$ (m|m') of the above encoder are defined by formula (1) below;

$$P_t(m|m')=Pr\{S_t=m|S_{t-1}=m'\} \quad (1)$$

where Pr {A|B} at the right side of the above equation represents the conditional probability with which A occurs under the conditions in which B occurs. The transition probabilities $P_t$ (m|m') are equal to the probability Pr $\{i_t=i\}$ that input $i_t$ at time t is equal to i when a transition from state m' to state m occurs with input i as shown by formula (2) below.

$$P_t(m|m')=Pr\{i_t=i\} \quad (2)$$

The memoryless channel 202 having noises receives $X_1^T$ as input and outputs $Y_1^T$. If a received value of n bits is output in a time slot, the output at time t is expressed by $y_t=(y_{t1}, y_{t2}, \ldots, y_{tk})$ and the output system is expressed by $Y_1^T=(y_1, y_2, \ldots, y_T)$. Then, the transition probabilities of the memoryless channel 202 having noises can be defined for all values of t ($1 \leq t \leq T$) by using the transition probability of each symbol, or Pr $\{y_j|x_j\}$.

$$Pr\{Y_1^t|X_1^t\} = \prod_{j=1}^{t} Pr\{y_j|x_j\} \quad (3)$$

Now, $\gamma_{tj}$ is defined by formula (4) below as the likelihood of input information at time t when $Y_1^T$ is received, or the soft-output to be obtained.

$$\lambda_{ij} = \frac{Pr\{i_{ij} = 1|Y_1^T\}}{Pr\{i_{ij} = 0|Y_1^T\}} \quad (4)$$

When the BCJR algorithm, probabilities $\alpha_t$, $\oplus_t$ and $\gamma_t$ are defined respectively by means of formulas (5) through (7) below. Note that Pr {A; B} represents the probability with which both A and B occur.

$$\alpha_t(m)=Pr\{S_t=m;Y_1^T\} \quad (5)$$

$$\beta_t(m)=Pr\{Y_{t+1}^T|S_t=m\} \quad (6)$$

$$\gamma_t(m',m)=Pr\{S_t=m;y_t|S_{t-1}=m'\} \quad (7)$$

Now, the probabilities of $\alpha_t$, $\beta_t$ and $\gamma_t$ will be described by referring to FIG. 2, which is a trellis diagram, or a state transition diagram, of the encoder 201. Referring to FIG. 2, $\alpha_{t-1}$ corresponds to the passing probability of each state at time t-1 as computed on a time series basis from the state of starting the coding $S_0=0$ by using the received value and $\beta_t$ corresponds to the passing probability of each state at time t as computed on an inverse time series basis from the state of ending the coding $S_T=0$ by using the received value, while $\gamma_t$ corresponds to the reception probability of the output of each branch showing a transition from a state to another at time t as computed on the basis of the received value and the input probability.

Then, the soft-output $\gamma_{tj}$ is expressed in terms of the probabilities $\alpha_t$, $\beta_t$ and $\gamma_t$ in a manner as shown in formula (8) below.

$$\lambda_{ij} = \frac{\sum_{m',m; j(m',m)=1} \alpha_t(m')\gamma_t(m', m)\beta_t(m)}{\sum_{m',m; j(m',m)=0} \alpha_t(m')\gamma_t(m', m)\beta_t(m)} \quad (8)$$

Meanwhile, formula (9) below holds true for t=1, 2, . . . , T.

$$\alpha_t(m) = \sum_{m'=0}^{M-1} \alpha_{t-1}(m')\gamma_t(m', m) \quad (9)$$

Similarly, formula (10) holds true also for t=1, 2, . . . , T.

$$\beta_t(m) = \sum_{m'=0}^{M-1} \beta_{t+1}(m')\gamma_{t+1}(m, m') \quad (10)$$

where $\beta_T(0)=1$, $\beta_T(m)=0 (m \neq 0)$

Finally, formula (11) holds true for $\gamma_t$.

$$\gamma_t(m', m) = \begin{cases} P_t(m|m') \cdot Pr\{y_t|x(m', m)\} = \\ Pr\{i_t = i(m', m)\} \cdot Pr\{y_t|x(m', m)\} \\ \quad : {}^*1 \\ 0 : {}^*2 \end{cases} \quad (11)$$

:*1 ... when a transition occurs from m' to m with input i.

:*2 ... when no transition occurs from m' to m with input i.

Thus, for soft-output decoding, applying the BCJR algorithm, the decoder 203 determines the soft-output $\gamma_t$ by passing through the steps shown in FIG. 3, utilizing the above relationships.

More specifically, in Step S201, the decoder 203 computes the probabilities $\alpha_t$ (m) and $\gamma_t$ (m', m), using the formulas (9) and (11) above, each time it receives $y_t$.

Then, in Step S202, after receiving all the system $Y_1^T$, the decoder 203 computes the probability $\beta_t$ (m) of state m for all values of time t, using the formula (10) above.

Thereafter, in Step S203, the decoder 203 computes the soft-output $\gamma_t$ at each time t by substituting the values obtained in Steps S201 and S202 for the probabilities $\alpha_t$, $\beta_t$ and $\gamma_t$ in the formula (8) above.

With the above described processing steps, the decoder 203 can carry out the soft-output decoding, applying the BCJR algorithm.

However, the BCJR algorithm is accompanied by a problem that it involves a large volume of computational operations because it requires to directly hold probabilities as values to be used for computations and employ multiplications. As an attempt for reducing the volume of computational operations, Robertson, Villebrun and Hoeher, "A Comparison of Optimal and sub-optimal MAP decoding algorithms operating under the doman", IEEE Int. Conf. On Communications, pp. 1009–1013, June 1995, proposes Max-Log-MAP Algorithm and Log-MAP Algorithm (to be referred to as Max-Log-BCJR algorithm and Log-BCJR algorithm respectively hereinafter).

Firstly, Max-Log-BCJR algorithm will be discussed below. With the Max-Log-BCJR algorithm, the probabilities $\alpha_t$, $\beta_t$ and $\gamma_t$ are expressed in terms of natural logarithm so that the multiplications for determining the probabilities are replaced by a logarithmic addition as expressed by formula (12) below and the logarithmic addition is approximated by a logarithmic maximizing operation as expressed by formula (13) below. Note that in the formula (13), max (x, y) represents a function for selecting either x and y that has a larger value.

$$\log(e^x \cdot e^y) = x + y \quad (12)$$

$$\log(e^x + e^y) = \max(x, y) \quad (13)$$

For simplification, the natural logarithm is expressed by I and values $\alpha_t$, $\beta_t$, $\gamma_t$ and $\lambda_t$ are expressed respectively by $I\alpha_t$, $I\beta_t$, $I\gamma_t$ and $I\lambda_t$ in the domain of the natural logarithm as shown in formula (14) below.

$$\begin{cases} I\alpha_t(m) = \log(\alpha_t(m)) \\ I\beta_t(m) = \log(\beta_t(m)) \\ I\gamma_t(m) = \log(\gamma_t(m)) \\ I\lambda_t = \log\lambda_t \end{cases} \quad (14)$$

With the Max-Log-BCJR algorithm, the log likelihoods, $I\alpha_t$, $I\beta_t$, $I\gamma_t$ are approximated by using formulas (15) through (17) below. Note that the maximum value max in state m' at the right side of the equation of (15) is determined in state m' showing a transition to state m. Similarly, the maximum value max in state m' at the right side of the equation of (16) is determined in state m' showing a transition to state m.

$$I\alpha_t(m) \approx \max_{m'}(I\alpha_{t-1}(m') + I\gamma_t(m', m)) \quad (15)$$

$$I\beta_t(m) \approx \max_{m'}(I\beta_{t+1}(m') + I\gamma_{t+1}(m, m')) \quad (16)$$

$$I\gamma_t(m', m) = \log(Pr\{i_t = i(m', m)\}) + \log(Pr\{y_t|x(m', m)\}) \quad (17)$$

With the Max-Log-BCJR algorithm, logarithmic soft-output $I\lambda_t$ is also approximated by using formula (18) below. Note that, in the equation of (18), the maximum value max of the first term at the right side is determined in state m' showing a transition to sate m when "1" is input and the maximum value max of the second term at the right side of the above equation is determined in state m' showing a transition to state m when "0" is input.

$$I\lambda_{tj} \cong \max_{\substack{m', m \\ i_j(m', m) = 1}} (I\alpha_{t-1}(m') + I\gamma_t(m', m) + I\beta_t(m)) - \quad (18)$$

$$\max_{\substack{m', m \\ i_j(m', m) = 1}} (I\alpha_{t-1}(m') + I\gamma_t(m', m) + \beta_t(m))$$

Thus, for soft-output decoding, applying the Max-Log-BCJR algorithm, the decoder 203 determines soft-output $\lambda_t$ by passing through the steps shown in FIG. 3, utilizing the above relationships.

More specifically, in Step S211, the decoder 203 computes the log likelihoods $I\alpha_t$ (m) and $I\gamma_t$ (m',m), using the formulas (15) and (17) above, each time it receives $y_t$.

Then, in Step S212, after receiving all the system $Y_1^T$, the decoder 203 computes the log likelihood $I\beta_t$ (m) of state m for all values of time t, using the formula (16) above.

Thereafter, in Step S213, the decoder 203 computes the log soft-output $I\lambda_t$ at each time t by substituting the values obtained in Steps S211 and S212 for the log likelihoods $I\alpha_t$, $I\beta_t$ and $I\gamma_t$ in the formula (18) above.

With the above described processing steps, the decoder 203 can carry out the soft-output decoding, applying the Max-Log-BCJR algorithm.

As pointed out above, since the Max-Log-BCJR algorithm does not involve any multiplications, it can greatly reduce the volume of computational operations if compared with the BCJR algorithm.

Now, the Log-BCJR algorithm will be discussed below. The Log-BCJR algorithm is devised to improve the accuracy of approximation of the Max-Log-BCJR algorithm. More specifically, the Log-BCJR algorithm, a correction term is added to the addition of probabilities of the formula (13) to obtain formula (19) below so that the sum of the addition of the formula (19) may represent a more accurate logarithmic value. The correction is referred to as log-sum correction hereinafter.

$$\log(e^x + e^y) = \max(x, y) + \log(1 + e^{-|x-y|}) \quad (19)$$

The logarithmic operation of the left side of the equation (19) is referred to as log-sum operation and, for the purpose of convenience, the operator of a log-sum operation is expressed by "#" as shown in formula (20) below (although it is expressed by "E" in the above paper) to follow the numeration system described in S. S. Pietrobon, "Implementation and performance of a turbo/MAP decoder, Int. J. Satellite Commun., vol. 16 pp. 23–46, January–February 1998". Then, the operator of a cumulative addition is expressed by "#Σ" as shown in formula (21) below (although it is expressed by "E" in the above paper).

$$x\#y=\log(e^x+e^y) \quad (20)$$

$$\#\sum_{i=0}^{M-1} x_i = ((\ldots((x_0\#x_1)\#x_2)\ldots)\#x_{M-1}) \quad (21)$$

By using the operator, the log likelihoods, $I\alpha_t$ and $I\beta_t$ and the log soft-output $I\lambda_t$ can be expressed respectively in a manner as shown in formulas (22) through (24) below. Since the log likelihood $I\gamma_t$ is expressed by the formula (17) above, it will not be described here any further.

$$I\alpha_t(m) = \#\sum_{m'=0}^{M-1}(I\alpha_{t-1}(m') + I\gamma_t(m', m)) \quad (22)$$

$$I\beta_t(m) = \#\sum_{m'=0}^{M-1}(I\beta_{t+1}(m') + I\gamma_{t+1}(m, m')) \quad (23)$$

$$I\lambda_{tj}(m) = \#\sum_{\substack{m',m \\ i_j(m',m)=1}}(I\alpha_{t-1}(m') + I\gamma_t(m', m) + I\beta_t(m)) - \\ \#\sum_{\substack{m',m \\ i_j(m',m)=0}}(I\alpha_{t-1}(m') + I\gamma_t(m', m) + I\beta_t(m)) \quad (24)$$

Note that the cumulative addition of the log-sum operations in state m' at the right side of the equation of (22) is determined in state m' showing a transition to state m. Similarly, the cumulative addition of the log-sum operations in state m' at the right side of the equation of (23) is determined in state m' showing a transition to state m. In the equation of (24), the cumulative addition of the log-sum operations at the first term of the right side is determined in state m' showing a transition to state m when the input is "1" and the cumulative addition of the log-sum operations at the second term of the right side is determined in state m' showing a transition to state m when the input is "0".

Thus, for the soft-output decoding, applying the Log-BCJR algorithm, the decoder 203 determines soft-output $\lambda_t$ by passing through the steps shown in FIG. 4, utilizing the above relationships.

More specifically, in Step S211, the decoder 203 computes the log likelihoods $I\alpha_t$ (m) and $I\gamma_t$ (m', m) using the formulas (22) and (17) above, each time it receives $y_1$.

Then, in Step S212, after receiving all the system $Y_1^T$, the decoder 203 computes the log likelihood $I\beta_t$ (m) of state m for all values of time t, using the formula (23) above.

Thereafter, in Step S213, the decoder 203 computes the log soft-output $I\lambda_t$ at each time t by substituting the values obtained in Steps S211 and S212 for the log likelihoods $I\alpha_t$, $I\beta_t$ and $I\gamma_t$ in the formula (24) above.

With the above described processing steps, the decoder 203 can carry out the soft-output decoding, applying the Log-BCJR algorithm. Since the correction term that is the second term at the right side of the above equation of (19) is expressed by a one-dimensional function relative to variable |x−y|, the decoder 203 can accurately calculate probabilities when the values of the second term are stored in advance in the form of a table in a ROM (Read-Only Memory).

By comparing the Log-BCJR algorithm with the Max-Log-BCJR algorithm it will be seen that, while it entails an increased volume of arithmetic operations, it does not involve any multiplications and the output is simply the logarithmic value of the soft-output of the BCJR algorithm if the quantization error is disregarded.

Meanwhile, methods that can be used for correcting the above described log-sum includes the secondary approximation method of approximating the relationship with variable |x−y| by so-called secondary approximation and the interval division method of arbitrarily dividing variable |x−y| into intervals and assigning predetermined values to the respective intervals in addition to the above described method of preparing a table for the values of the correction term. These log-sum correction methods are developed by putting stress on the performance of the algorithm in terms of accurately determining the value of the correction term. However, they are accompanied by certain problems including a large circuit configuration and slow processing operations.

Therefore, studies are being made to develop high speed log-sum correction methods. Such methods include the linear approximation method of linearly approximating the relationship with variable |x−y| and/or the threshold value approximation method of determining values for predetermined intervals of variable |x−y| respectively by using predetermined threshold values.

The linear approximation method is designed to approximate function $F=\log\{1+e^{\wedge}(-|x-y|)\}$ as indicated by curve C in FIG. 5A by a linear function as indicated by straight line L. The straight line L in FIG. 5A is expressed by equation F=−0.3 (|x−y|)+log 2 and the correction term shows a degree of degradation of about 0.1 db.

On the other hand, the threshold value approximation method is designed to approximate function $F=\log\{1+e^{\wedge}(-|x-y|)\}$ as indicated by curve C in FIG. 5B by a step function as indicated by curve T. The curve T in FIG. 5B is expressed by a function that gives log 2 for the interval of $0 \leq |x-y| < 1$ and 0 for the interval of $|x-y| \geq 1$. The correction term shows a degree of degradation of about 0.2 dB.

Meanwhile, when performing a log-sum correction with any of the above described methods, the computed values of the log likelihoods $I\alpha_t$, $I\beta_t$ can shift from positive to negative or vice versa to cross the zero line as shown in FIG. 6.

Therefore, the circuit for computing the log likelihoods $I\alpha_t$, $I\beta_t$ needs to cover a number of bits necessary for expressing both positive and negative values typically by using the complement of 2. Such an arrangement inevitably raises the dimension of the circuit.

BRIEF SUMMARY OF THE INVENTION

In view of the above identified circumstances, it is therefore the object of the present invention to provide a decoder and a decoding method that can perform log-sum corrections with a reduced circuit dimension without adversely affecting the decoding performance of the circuit.

In an aspect of the invention, the above object is achieved by providing a decoder for determining the log likelihood logarithmically expressing the probability of passing a given state on the basis of the received value regarded as soft-input and decoding the input by using the log likelihood, said decoder comprising a processing means for adding a correction term and a predetermined value to the log likelihood, in order to obtain a corrected log likelihood, the correction term being expressed in a one-dimensional function relative to a variable, so that the corrected log likelihoods uniformly have positive values or negative values.

Thus, with a decoder according to the invention, the processing means adds a predetermined value to the correction term so as to provide a unified symbol for identifying the positiveness or negativeness of the computed log likelihood.

In another aspect of the invention, there is provided a decoding method for determining the log likelihood logarithmically expressing the probability of passing a given state on the basis of the received value regarded as soft-input and decoding the input by using the log likelihood, said decoding method comprising a processing step for adding a correction term and a predetermined value to the log likelihood, in order to obtain a correct log likelihood, the correction term being expressed in a one-dimensional function relative to a variable, so that the corrected log likelihoods uniformly have positive values or negative values.

Thus, with a decoding method according to the invention, the processing step adds a correction term and a predetermined value to the log likelihood, in order to obtain a corrected log likelihood, so that the corrected log likelihoods uniformly have positive values or negative values.

As described above, a decoder according to the invention is adapted to determine the log likelihood logarithmically expressing the probability of passing a given state on the basis of the received value regarded as soft-input and decode the input by using the log likelihood, said decoder comprising a processing means for adding a correction term and a predetermined value to the log likelihood, in order to obtain a corrected log likelihood, the correction term being expressed in a one-dimensional function relative to a variable, so that the corrected log likelihoods uniformly have positive values or negative values.

Therefore, with a decoder according to the invention, the processing means adds a correction term and a predetermined value to the log likelihood, in order to obtain a corrected log likelihood, so that the corrected log likelihood uniformly have positive values or negative values, which makes it possible to reduce the dimension of the circuit without adversely affecting the decoding performance the circuit.

Similarly, a decoding method according to the invention is adapted to determine the log likelihood logarithmically expressing the probability of passing a given state on the basis of the received value regarded as soft-input and decode the input by using the log likelihood, said decoding method comprising a processing step for adding a correction term and a predetermined value to the log likelihood, in order to obtain a corrected log likelihood, the correction term being expressed in a one-dimensional function relative to a variable, so that the corrected log likelihoods uniformly have positive values or negative values.

Therefore, with a decoding method according to the invention, the processing step adds a correction term and a predetermined value to the log likelihood, in order to obtain a corrected log likelihood, so that the corrected log likelihoods uniformly have positive values or negative values, which makes it possible to reduce the dimension of the circuit without adversely affecting the decoding performance of the circuit.

DETAILED DESCRIPTION OF THE INVENTION

Now, the present invention will be described by referring to the views of the accompanying drawings that illustrate preferred embodiments of the invention.

Figure 1:
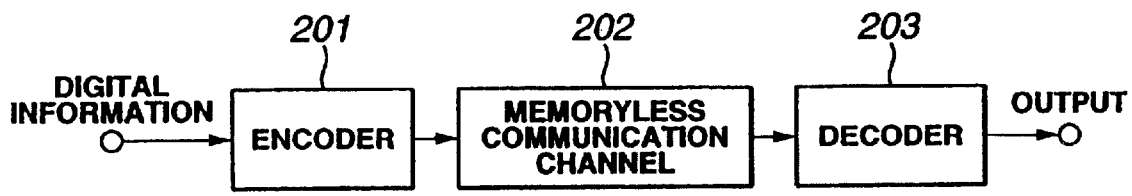
FIG. 1 is a schematic block diagram of a communication model.
Figure 2:
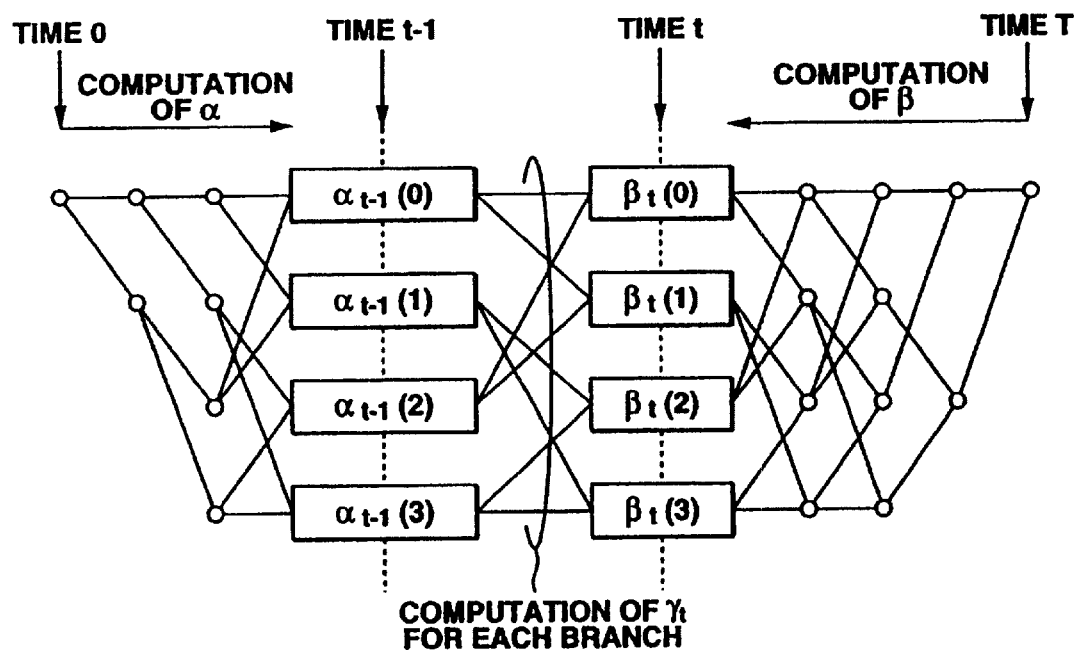
FIG. 2 is a schematic trellis diagram of a conventional encoder, illustrating the contents of probabilities $\alpha_t$, $\beta_t$ and $\gamma_t$.
Figure 3:
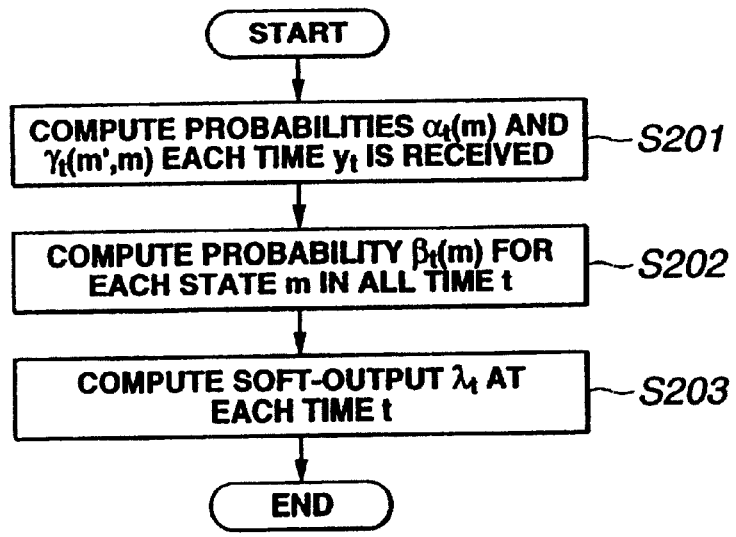
FIG. 3 is a flow chart illustrating the processing steps of a conventional decoder for decoding a soft-output by applying the BCJR algorithm.
Figure 4:
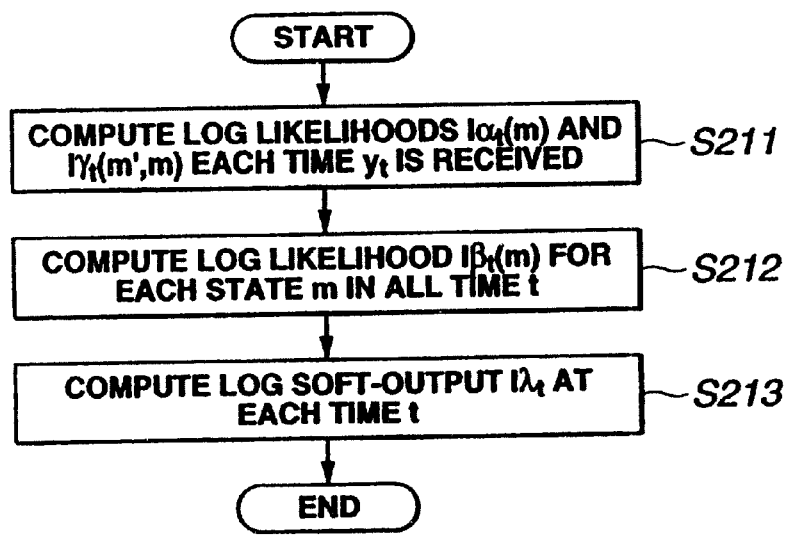
FIG. 4 is a flow chart illustrating the processing steps of a conventional decoder for decoding a soft-output by applying the Max-Log-BCJR algorithm.
Figure 5A:
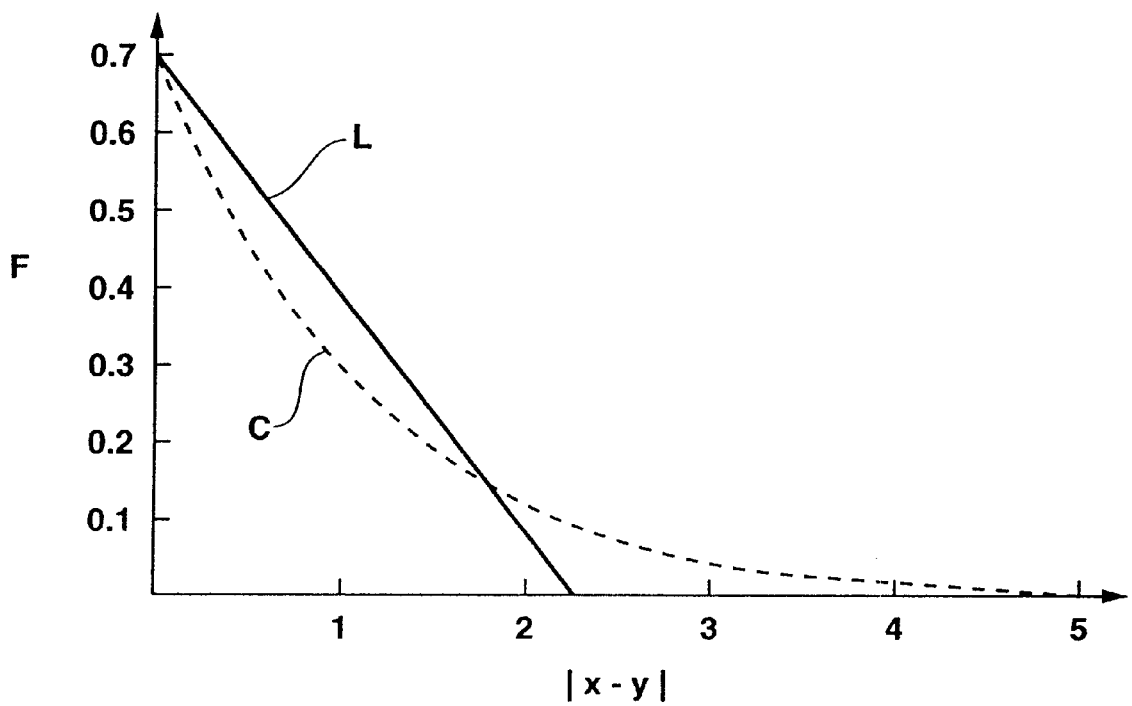
FIG. 5A is a graph illustrating a function having a correction term and an approximating function using a linear approximation technique.
Figure 5B:
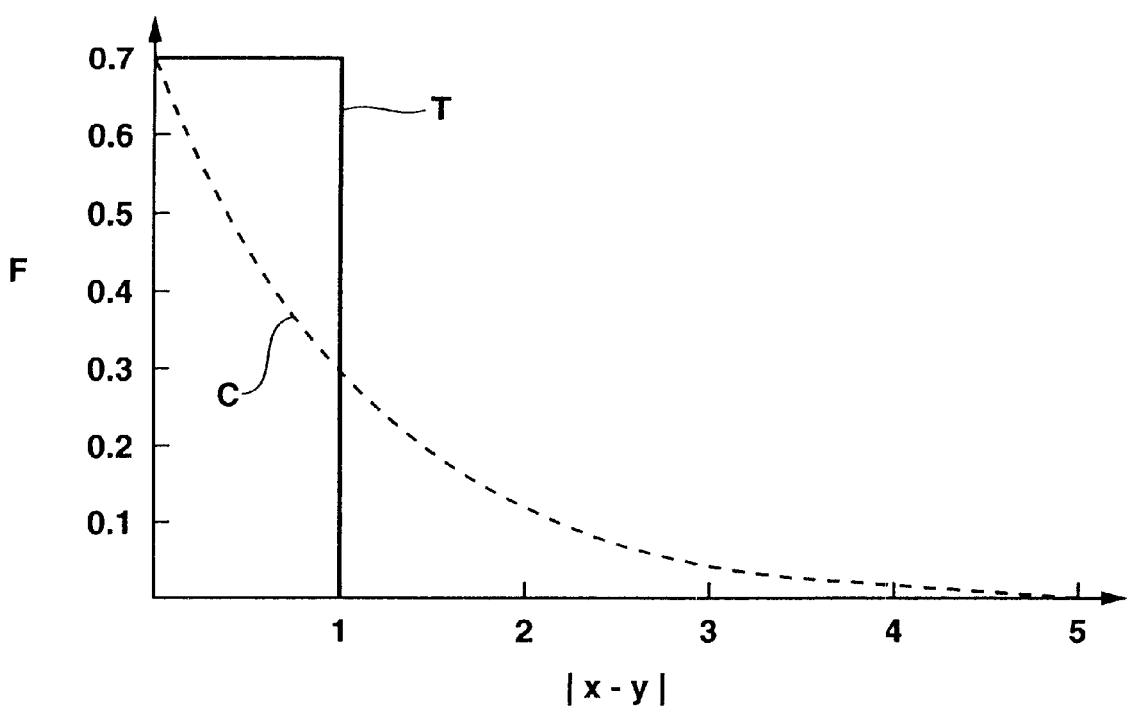
FIG. 5B is a graph illustrating a function having a correction term and an approximating function using a threshold value approximation technique.
Figure 6:
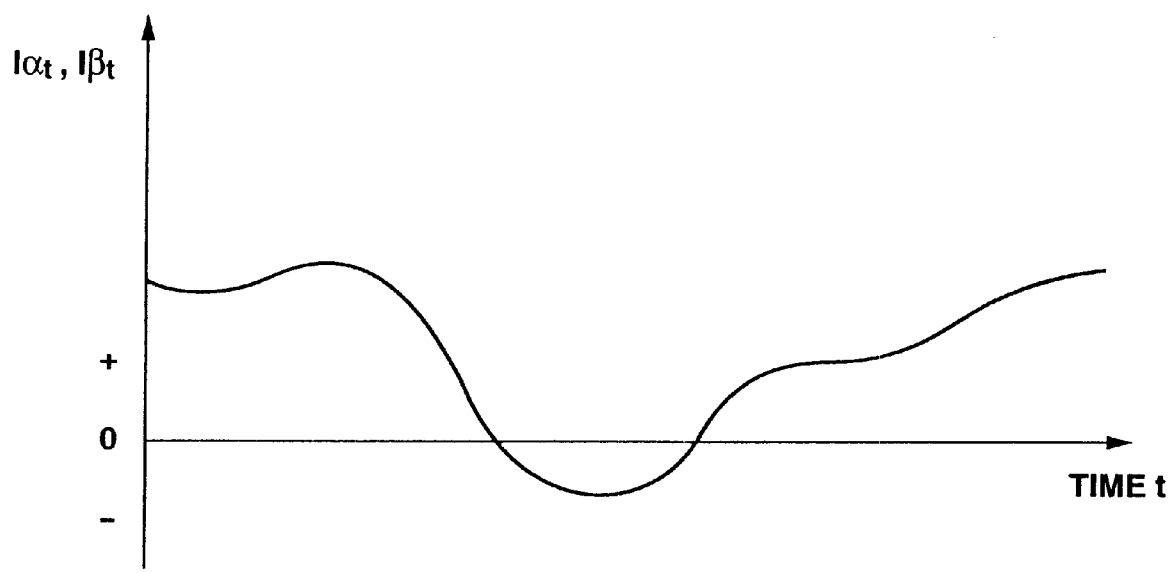
FIG. 6 is a graph schematically illustrating a computed log likelihood.
Figure 7:
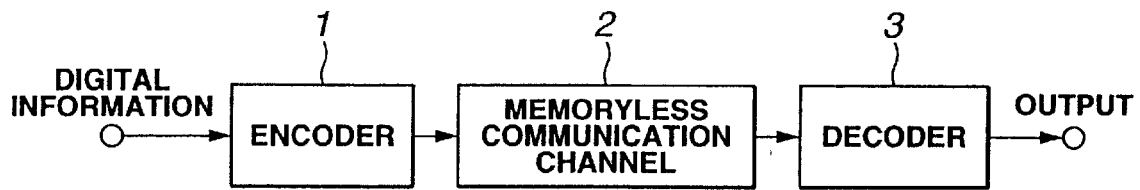
FIG. 7 is a schematic block diagram of a communication model to which a data transmission/reception system comprising an embodiment of the invention is applied.

FIG. 7 is a schematic block diagram of a communication model to which a data transmission/reception system comprising an embodiment of the invention is applied. More specifically, the data transmission/reception system includes a transmission unit (not shown) comprising an encoder 1 for putting digital information into convolution codes, a memoryless communication channel 2 having noises and adapted to transmitting the output of the transmission unit and a reception unit (not shown) comprising a decoder 3 for decoding the conventional codes from the encoder 1.

In the data transmission/reception system, the decoder 3 is adapted to decode the convolution codes output from the encoder 1 on the basis of the maximum a posteriori probability (to be referred to as MAP hereinafter) obtained by using the Log-MAP algorithm (to be referred to as the Log-BCJR algorithm hereinafter) as described in Robertson, Villebrun and Hoeher, "A Comparison of Optimal and Sub-Optimal MAP Decoding Algorithms Operating in the Domain", IEEE Int. Conf. On Communications, pp. 1009–1013, June 1995. More specifically, it is adapted to perform a log-sum correction on the log likelihoods of $I\alpha_t$, $I\beta_t$ and $I\gamma_t$ and the log soft-output $I\lambda_t$ that are logarithmic expressions of probabilities $\alpha_t$, $\beta_t$, $\gamma_t$ and soft output $\lambda_t$ by means of the natural logarithm.

In the following description, the M states (translational states) representing the contents of the shift registers of the encoder 1 are denotes by integer m (m=0, 1, . . . , M−1) and the state at time t is denoted by $S_t$. If information of k bits is input in a time slot, the input at time t is expressed by $i_t=(i_{t1}, i_{t2}, \ldots, i_{tk})$ and the input system is expressed by $I_1^T=(i_1, i_2, \ldots, i_T)$. If there is a transition from state m' to state m, the information bits corresponding to the transition are expressed by i (m', m)=($i_1$ (m', m), $i_2$ (m', m), . . . , $i_k$ (m', m)). Additionally, if a code of n bits is output in a time slot, the output at time t is expressed by $x_t=(x_{t1}, x_{t2}, \ldots, x_{tn})$ and the output system is expressed by $X_1^T=(x_1, x_2, \ldots, x_T)$. If there is a transition from state m' to state m, the information bits corresponding to the transition are expressed by x (m', m)=($x_1$ (m', m), $x_2$ (m', m), . . . , $x_n$ (m', m)). The memoryless communication channel 2 receives $X_1^T$ as input and outputs $Y_1^T$. If a received value of n bits is output in a time slot, the output at time t is expressed by $y_t=(y_{t1}, y_{t2}, \ldots, t_m)$ and the output system is expressed by $Y_1^T=(y_1, y_2, \ldots, y_T)$.

Figure 8:
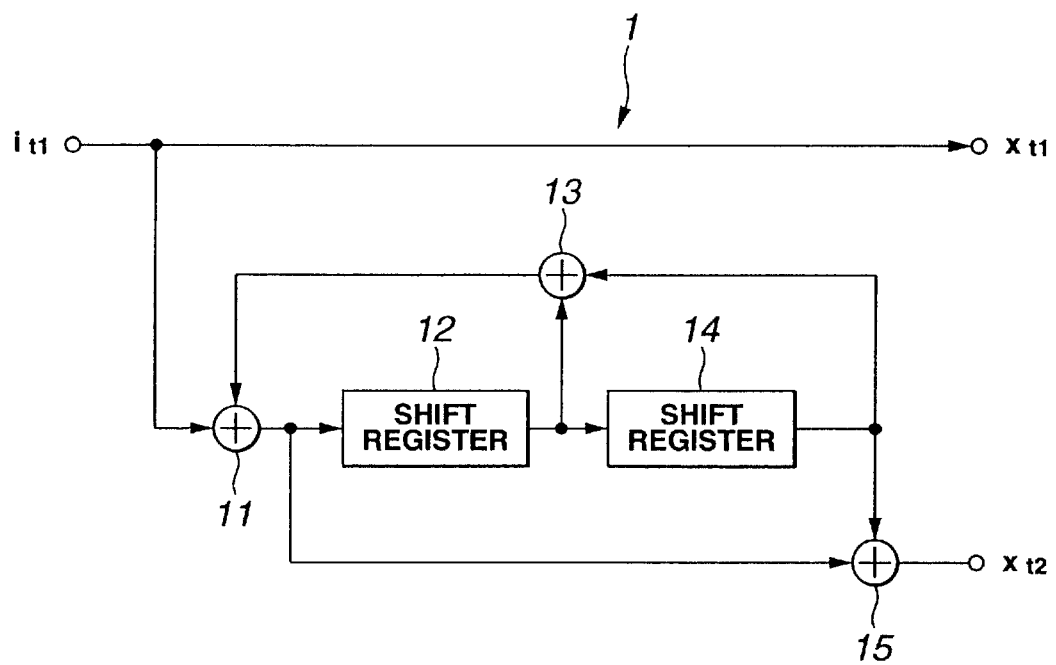

As shown in FIG. 8, the encoder 1 typically comprises three exclusive OR circuits 11, 13, 15 and a pair of shift registers 12, 14 and is adapted to carry out conventional operations with a constraint length of "3".

The exclusive OR circuit 11 is adapted to carry out an exclusive OR operation, using 1-bit input data $i_{t1}$ and the data fed from the exclusive OR circuit 13, and supply the shift register 12 and the exclusive OR circuit 15 with the outcome of the operation.

The shift register 12 keeps on feeding the 1-bit data it holds to the exclusive OR circuit 13 and the shift register 14. Then, the shift register 12 holds the 1-bit data fed from the exclusive OR circuit 11 in synchronism with a clock and additionally feeds the 1-bit data to the exclusive OR circuit 13 and the shift register 14.

The exclusive OR circuit 13 is adapted to carry out an exclusive OR operation, using the data fed from the shift registers 12, 14 and supply the shift register 12 with the outcome of the operation.

The shift register 14 keeps on feeding the 1-bit data it holds to the exclusive OR circuits 13, 15. Then, the shift register 14 holds the 1-bit data fed from the shift register 12 in synchronism with a clock and additionally feeds the data to the exclusive OR circuits 13, 15.

The exclusive OR circuit 15 is adapted to carry out an exclusive OR operation, using the data fed from the exclusive OR circuit 11 and the data fed from the shift register 14 and outputs the outcome of the operation as 1-bit output data $x_{t2}$ of 2-bit output data $x_t$ externally.

Thus, as the encoder 1 having the above described configuration receives 1-bit input data $i_{t1}$, it outputs the input data as 1-bit input data $x_1$ that is a systematic component of 2-bit output data $x_t$ and carries out a recursive convolution operation on the input data $i_{t1}$. Then, it outputs externally the outcome of the operation as the other 1-bit output data $x_{t2}$ of 2-bit output data $x_t$. In short, the encoder 1 performs a recursive systematic convolutional operation with a coding ratio of "½" and outputs externally output data $x_t$.

Figure 9:
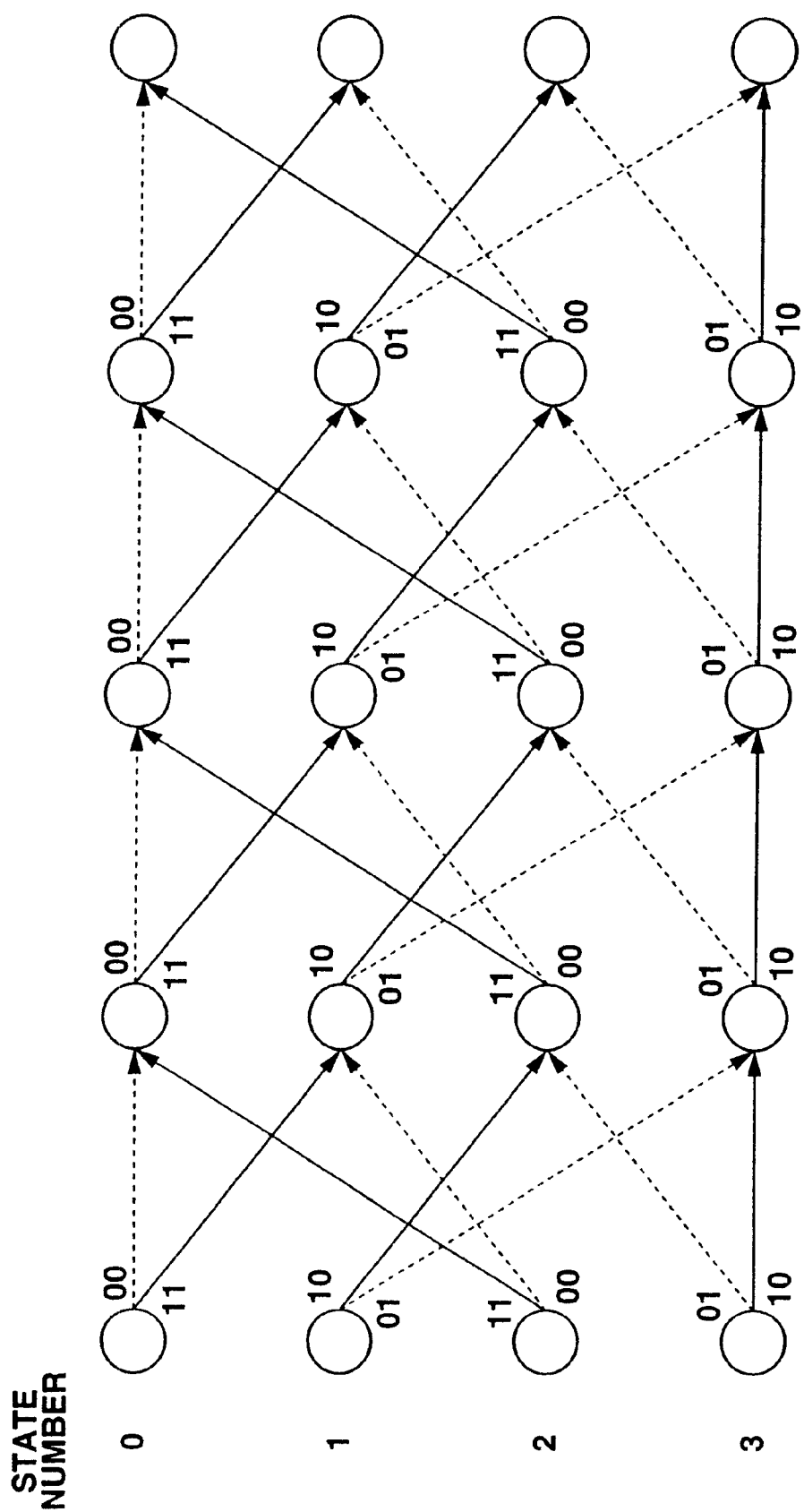
FIG. 9 is a schematic illustration of the trellis of the encoder of FIG. 7.

FIG. 9 illustrates the trellis of the encoder 1. Referring of FIG. 9, each path indicated by a broken line shows a case where input data $i_{t1}$ is "0" and each path indicated by a solid line shows a case where input data $i_{t1}$ is "1". The label applied to each path indicates 2-bit output data $x_t$. The states here are such that the contents of the shift register 12 and those of the shift register 14 are sequentially arranged and the states "00", "10", "01", "11" are denoted respectively by state numbers "0", "1", "2", "3". Thus, the number of states M of the encoder 1 is four and the trellis has such a structure that there are two paths getting to the states in the next time slot from the respective states. In the following description, the states corresponding to the above state numbers are denoted respectively by state 0, state 1, state 2, state 3.

The coded output data $x_t$ of the encoder 1 are then output to the receiver by way of the memoryless communication channel 2.

Figure 10:
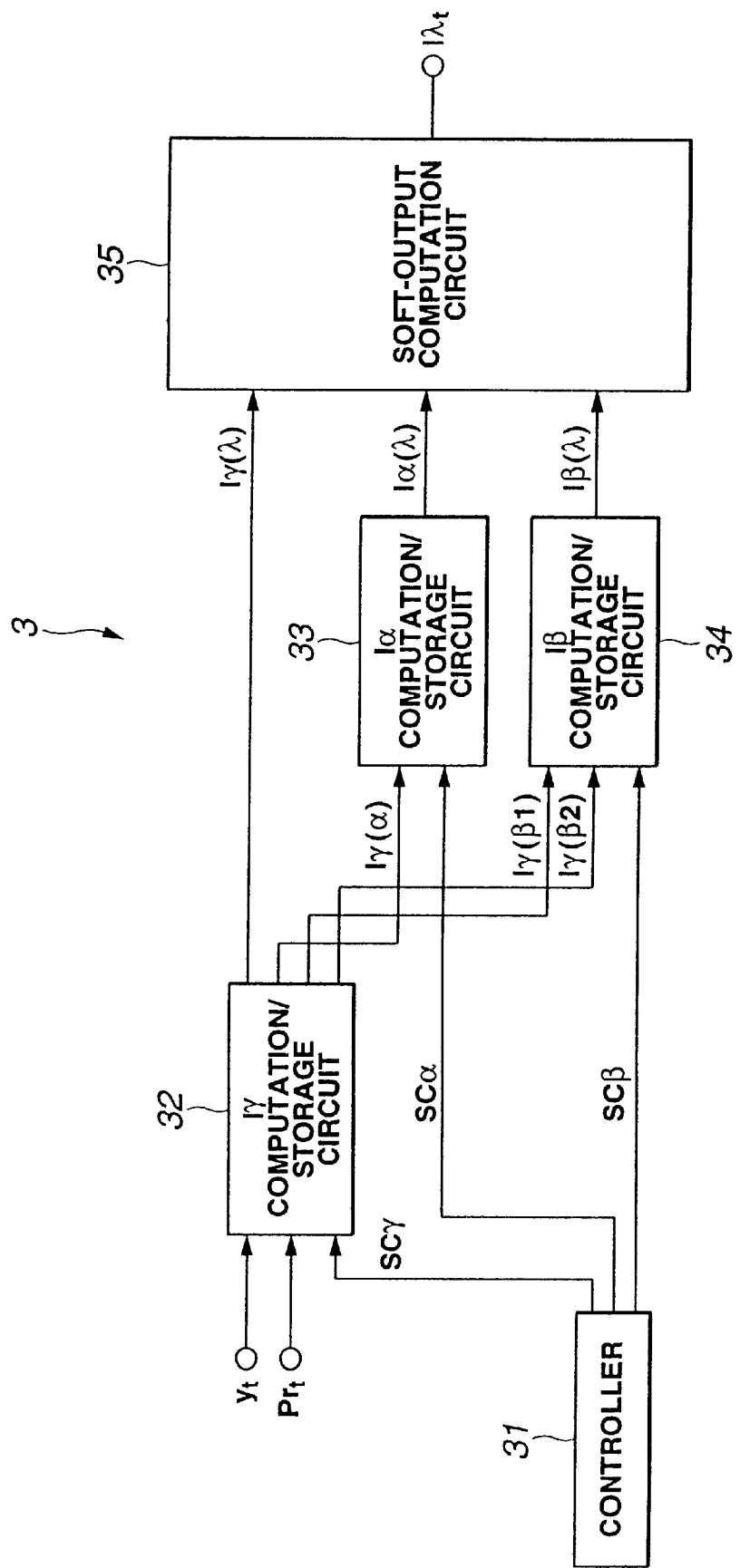
FIG. 10 is a schematic block diagram of the decoder of the data transmission/reception system of FIG. 7.

On the other hand, as shown in FIG. 10, the decoder 3 comprises a controller 31 for controlling the various components of the decoder 3, an Iγ computation/storage circuit 32 operating as the first probability computing means for computing and storing log likelihood Iγ as the first log likelihood, an Iα computation/storage circuit 33 operating as the second probability computing means for computing and storing log likelihood Iα as the second log likelihood, an Iβ computation/storage circuit 34 operating as the third probability computing means for computing and storing log likelihood Iβ as the third log likelihood and a soft-output computation circuit 35 operating as soft-output computing means for computing log soft-output $I\lambda_t$. The decoder 33 estimates the input data $i_t$ of the encoder 1 by determining the log soft-output $I\lambda_t$ from the received value $y_t$ showing an analog value under the influence of the noises generated on the memory less communication channel 2 and hence regarded as soft-output.

The controller 31 supplies control signals SCγ, SCα and SCβ respectively to the Iγ computation/storage circuit 32, the Iα computation/storage circuit 33 and the Iβ computation/storage circuit 34 to control these circuits.

The Iγ computation/storage circuit 32 carries out the operation of formula (25) below for each received value $y_t$ under the control of the control signal SCγ fed from the controller 31, using the received value $y_t$ and a priori probability $Pr_t$, to compute the log likelihood $I\gamma_t$ at time t and stores the obtained log likelihood. In short, the Iγ computation/storage circuit 32 computes the log likelihood Iγ expressing the probability γ in the log domain as determined for each received value $y_t$ on the basis of the code output pattern and the received value.

$$I\gamma_t(m', m) = \log(Pr\{i_t = i(m',m)\}) + \log(Pr\{y_t | x(m',m)\}) \quad (25)$$

The a priori probability $Pr_t$ is obtained as probability Pr $\{i_{t1}=1\}$ that an input data $i_{t1}$ is equal to "1" or probability Pr $\{i_{t1}=1\}$ that an input data $i_{t1}$ is equal to "0" as indicated by formula (26) below. The a priori probability $Pr_t$ can alternatively be obtained as probability Pr $\{i_{t1}=1\}$ or probability $\{i_{t1}=0\}$ by inputting the natural log value of the log likelihood ratio of probability Pr $\{i_t=1\}$ to Pr $\{i_{t1}=0\}$, considering the fact that the sum of the probability Pr $\{i_{t1}=1\}$ and the probability Pr $\{i_{t1}=0\}$ is equal to "1".

$$Pr_t = \begin{cases} \log Pr\{i_{tI} = 1\} \\ \log Pr\{i_{tI} = 0\} \end{cases} \quad (26)$$

The $I\gamma$ computation/storage circuit 32 supplies the log likelihood $I\gamma_t$ it stores to the $I\alpha$ computation/storage circuit 33, the $I\beta$ computation/storage circuit 34 and the soft-output computation circuit 35. More specifically, the $I\gamma$ computation/storage circuit 32 supplies the log likelihood $I\gamma_t$ to the $I\alpha$ computation/storage circuit 33, the $I\beta$ computation/storage circuit 34 and the soft-output computation circuit 35 in a sequence good for the processing operations of these circuits. In the following description, the log likelihood $I\gamma_t$ supplied from the $I\gamma$ computation/storage circuit 32 to the $I\alpha$ computation/storage circuit 33 is expressed by $I\gamma(\alpha)$, the log likelihood $I\gamma_t$ supplied from the $I\gamma$ computation/storage circuit 32 to the $I\beta$ computation/storage circuit 34 is expressed by $I\gamma(\beta1)$, $I\gamma(\beta2)$ and the log likelihood $I\gamma_t$ supplied from the $I\gamma$ computation/storage circuit 32 to soft-output computation circuit 35 is expressed by $I\gamma(\lambda)$.

The $I\alpha$ computation/storage circuit 33 carries out the operation of formula (27) below under the control of the control signal $SC\alpha$ fed from the controller 31, using the log likelihood $I\gamma(\alpha)$ fed from the $I\gamma$ computation/storage circuit 32 to compute the log likelihood $I\alpha_t$ at time t and stores the obtained log likelihood. In the formula (27), operator "#" denotes the so-called log sum operation for the log likelihood of transition from state m' to state m with input "0" and the log likelihood of transition from state m" to state m with input "1". More specifically, the $I\alpha$ computation/storage circuit 33 computes the log likelihood $I\alpha_t$ at time t by carrying out the operation of formula (28). In other words, the $I\alpha$ computation/storage 33 computes the log likelihood $I\alpha$ expressing in the log domain the probability $\alpha$ of transition from the coding starting state to each state as determined on a time series basis for each received value $y_t$. Then, the $I\alpha$ computation/storage circuit 33 supplies the log likelihood $I\alpha_t$ it stores to the soft-output computation circuit 35. At this time the $I\alpha$ computation/storage circuit 33 supplies the log likelihood $I\alpha_t$ to the soft-output computation circuit 35 in a sequence good for the processing operations of the circuit 35. In the following description, the log likelihood $I\alpha_t$ supplied from the $I\alpha$ computation/storage circuit 33 to the soft-output computation circuit 35 is expressed by $I\alpha(\lambda)$. The constant $\delta$ in formulas (27) and (28) below will be described hereinafter.

$$I\alpha_t(m)=(I\alpha_{t-1}(m')+I\gamma_t(m',m))\#(I\alpha_{t-1}(m'')+I\gamma_t(m'',m))+\delta \quad (27)$$

$$I\alpha_t(m)=\max(I\alpha_{t-1}(m')+I\gamma_t(m',m), I\alpha_{t-1}(m'')+I\gamma_t(m'',m))+\log(1+e^{-1(I\alpha^{t-1}(m')+I\gamma_t(m',m))-(I\alpha_{t-1}(m'')+I\gamma_t(m'',m))})+\delta \quad (28)$$

The $I\beta$ computation/storage circuit 34 carries out the operation of formula (29) below under the control of the control signal $SC\beta$ fed from the controller 31, using the log likelihoods $I\gamma(\beta1)$ and $I\gamma(\beta2)$ fed from the $I\gamma$ computation/storage circuit 32 to compute the log likelihoods $I\beta_t$ at time t of the two systems and stores the obtained log likelihoods. In the formula (29), operator "#" denotes the so-called log sum operation for the log likelihood of transition from state m' to state m with input "0" and the log likelihood of transition from state m" to state m with input "1". More specifically, the $I\beta$ computation/storage circuit 34 computes the log likelihood $I\beta_t$ at time t by carrying out the operation of formula (30). In other words, the $I\beta$ computation/storage 34 computes the log likelihood $I\beta$ expressing in the log domain the probability $\beta$ of inverse transition from the coding terminating state to each state as determined on a time series basis for each received value $y_t$. Then, the $I\beta$ computation/storage circuit 34 supplies the log likelihood $I\beta_t$ of one of the systems out of the log likelihoods $I\beta_t$ it stores to the soft-output computation circuit 35. At this time the $I\beta$ computation/storage circuit 34 supplies the log likelihood $I\beta_t$ to the soft-output computation circuit 35 in a sequence good for the processing operations of the circuit 35. In the following description, the log likelihood $I\beta_t$ supplied from the $I\beta$ computation/storage circuit 34 to the soft-output computation circuit 35 is expressed by $I\beta(\lambda)$. The constant $\delta$ in formulas (29) and (30) below is the same as the one in formulas (27) and (28) above and will be described hereinafter.

$$I\beta_t(m)=(I\beta_{t+1}(m')+I\gamma_{t+1}(m,m'))\#(I\beta_{t+1}(m'')+I\gamma_{t+1}(m,m''))+\delta \quad (29)$$

$$I\beta_t(m)=\max(I\beta_{t+1}(m')+I\gamma_{t+1}(m,m'), I\beta_{t+1}(m'')+I\gamma_{t+1}(m,m''))+\log(1+e^{-1(I\beta^{t+1}(m')+I\gamma_{t+1}(m,m'))-(I\beta_{t+1}(m'')+I\gamma_{t+1}(m,m''))})+\delta \quad (30)$$

The soft-output computation circuit 35 carries out the operation of formula (31) below, using the log likelihood $I\gamma(\lambda)$ fed from the $I\gamma$ computation/storage circuit 32 and the log likelihood $I\alpha(\lambda)$ fed from the $I\alpha$ computation/storage circuit 33, to compute the log soft-output $I\lambda_t$ at time t and stores the obtained log soft-outputs. After rearranging the log soft-outputs $I\lambda_t$ it sores, the soft-output computation circuit 35 outputs them externally. In the formula (31), operator "#$\Sigma$" denotes the cumulative addition of the so-called log sum operations using the above described operator "#".

$$I\lambda_t = \# \sum_{m',mi(m',m)=1} (I\alpha_{t-1}(m') + I\gamma_t(m',m) + I\beta_t(m)) - \quad (31)$$

$$\# \sum_{m',mi(m',m)=0} (I\alpha_{t-1}(m') + I\gamma_t(m',m) + I\beta_t(m))$$

The decoder 3 having the above described configuration computes the log likelihood $I\gamma_t$ (m', m) by means of the $I\gamma$ computation/storage circuit 32 and also the log likelihood $I\alpha_t$ (m) by means of the $I\alpha$ computation/storage circuit 33 each time it receives as input the soft-input value $y_t$ received by the receiving unit. Upon receiving all the received values $y_t$, the decoder 3 computes the log likelihood $I\gamma_t$ for each state m for all the values of time t by means of the $I\beta$ computation/storage circuit 34. Then, the decoder 3 computes the log soft-output $I\lambda_t$ for each time t by means of the soft-output computation circuit 35, using the obtained log likelihoods $I\alpha_t$, $I\beta_t$ and $I\gamma_t$. In this way, the decoder 3 can operate for soft-output decoding by applying the Log-BCJR algorithm.

Now, the decoder 3 operates with a reduced circuit size when computing the log likelihoods, $I\alpha_t$ and $I\beta_t$ by means of the $I\alpha$ computation/storage circuit 33 and the $I\beta$ computation/storage circuit 34. The $I\alpha$ computation/storage circuit 33 and the $I\beta$ computation/storage circuit 34 will be described in greater detail hereinafter.

Figure 11:
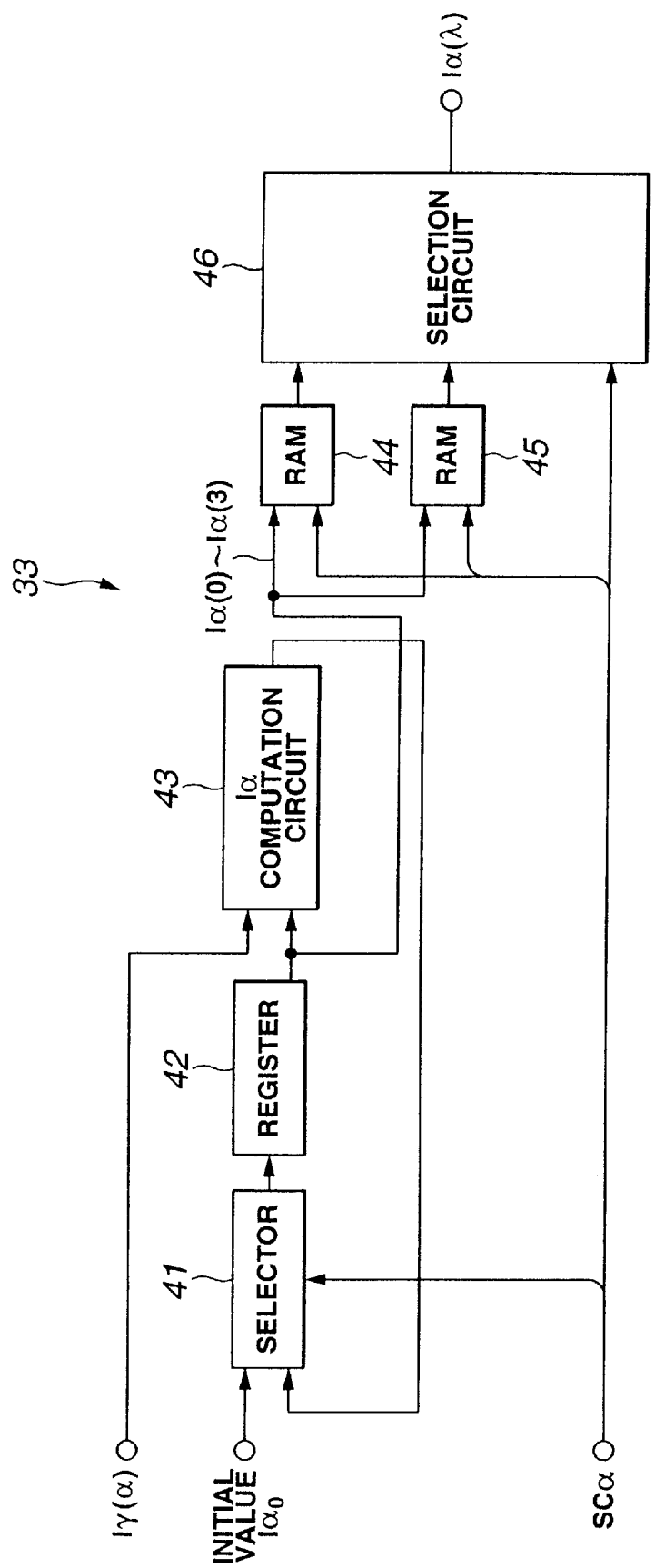
FIG. 11 is a schematic block diagram of the $I\alpha$ computation/storage circuit of the decoder of FIG. 9, illustrating the circuit configuration.

Firstly, the $I\alpha$ computation/storage circuit 33 will be described. As shown in FIG. 11, the $I\alpha$ computation/storage circuit 33 comprises a selector 41 for selecting either the computed log likelihoods $I\alpha$ or the initial value of the log likelihood $I\alpha_0$, a register 42 for holding either the computed log likelihoods $I\alpha$ or the initial value of the log likelihood $I\alpha_0$, an $I\alpha$ computation circuit 43 for computing the log likelihood $I\alpha$ in each state, RAMs (random access memories) 44, 45 for sequentially holding the log likelihoods $I\alpha$ of different states and a selection circuit 46 for selectively taking out the log likelihood $I\alpha$ read out from the RAMs 44, 45.

The selector 41 selects the initial value of the log likelihood $I\alpha_0$ at the time of initialization or the log likelihoods $I\alpha$ fed from the $I\alpha$ computation circuit 43 at any time except the time of initialization under the control of control signal $SC\alpha$ fed from the controller 31. The initialization occurs in the time slot immediately before the $I\gamma$ computation/storage circuit 32 starts outputting log likelihoods $I\gamma(\alpha)$. If the decoder 3 realizes the time when the encoder 1 starts a coding operation, $\log 1=0$ is given as initial value $I\alpha_0$ in state 0 whereas $\log 0 = -\infty$ is given as initial value in any other state. If, on the other hand, the decoder 3 does not realize the time when the encoder 1 starts a coding operation, $\log(1/M)$, or $\log(1/4)$ in the above instance, is given in all states. However, what is essential here is that a same value is given in all states so that 0 may alternatively be given in all states. The selector 41 supplies the initial value $I\alpha_0$ or the log likelihoods $I\alpha$, whichever it selects, to the register 42.

The register 42 holds the initial value $I\alpha_0$ or the log likelihoods $I\alpha$ supplied from the selector 41. Then, in the next time slot, the register 42 supplies the initial value $I\alpha_0$ or the log likelihoods $I\alpha$ it holds to the $I\alpha$ computation circuit 43 and the RAMs 44, 45.

Figure 12:
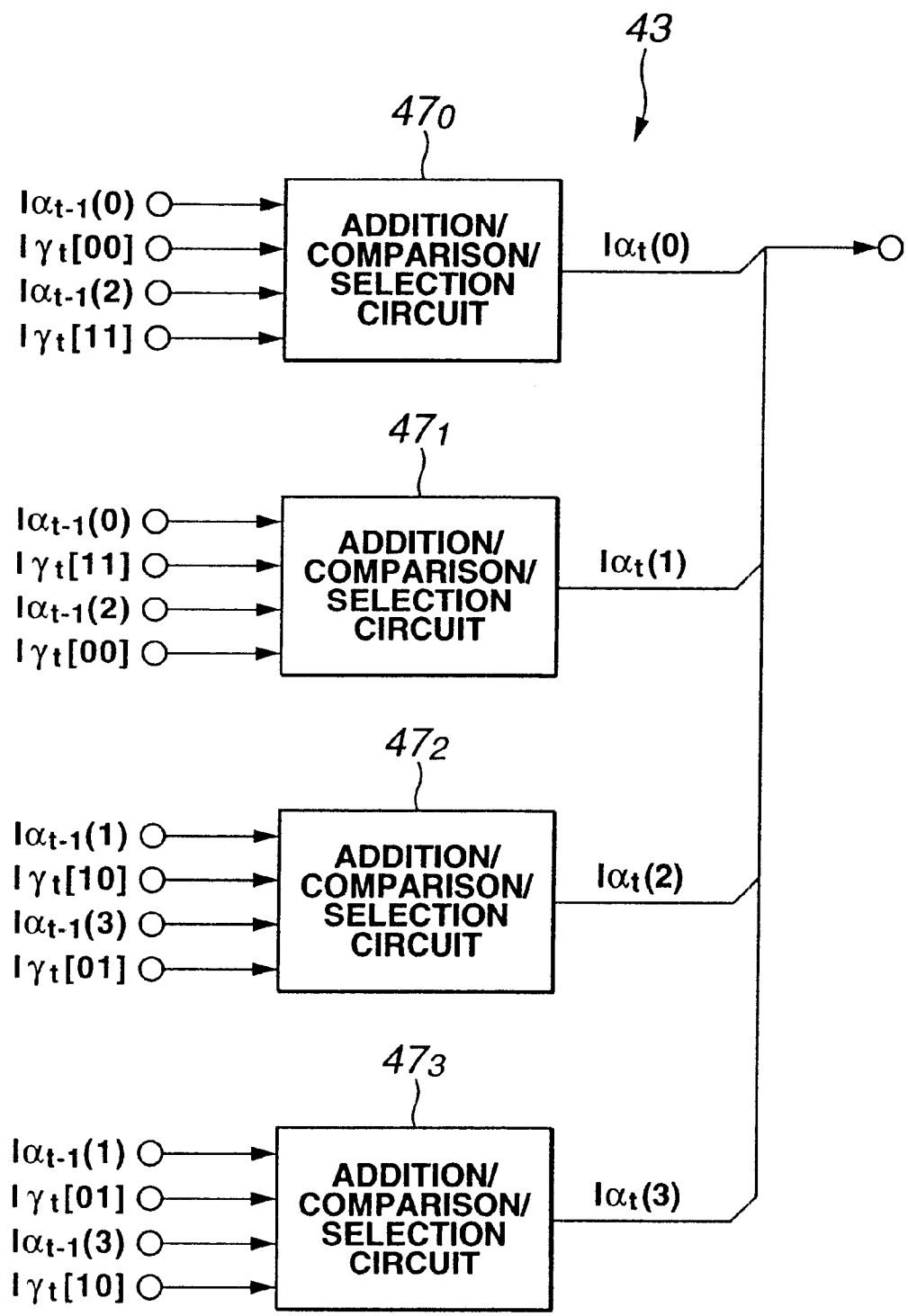
FIG. 12 is a schematic block diagram of the $I\alpha$ computation circuit of the $I\alpha$ computation/storage circuit of FIG. 11, illustrating the circuit configuration.

Referring now to FIG. 12, the $I\alpha$ computation circuit 43 comprises addition/comparison/selection circuits, the number of which corresponds to the number of states. In the above instance, the $I\alpha$ computation circuit 43 comprises four addition/comparison/selection circuits $47_0$, $47_1$, $47_2$ and $47_3$ as so many processing means.

Each of the addition/comparison selection circuits $47_0$, $47_1$, $47_2$ and $47_3$ are fed with the log likelihoods $I\gamma_t[00]$, $I\gamma_t[10]$, $I\gamma_t[01]$ and $I\gamma_t[11]$ of the branches corresponding to the respective outputs "00", "10", "01" and "11" on the trellis as computed by the $I\gamma$ computation/storage circuit 32 on the basis of the transitions on the trellis and the log likelihoods slot $I\alpha_{t-1}(0)$, $I\alpha_{t-1}(1)$, $I\alpha_{t-1}(2)$, $I\alpha_{t-1}(3)$ in all the states in the immediately preceding time. Then, each of the addition/comparison/selection circuits $47_0$, $47_1$, $47_2$ and $47_3$ determines the log likelihoods $I\alpha$ in the next time slot in state 0, state 1, state 2 and state 3.

More specifically, the addition/comparison/selection circuits $47_0$ receives the log likelihoods $I\gamma_t[00]$, $I\gamma_t[11]$ and the log likelihoods $I\alpha_{t-1}(0)$, $I\alpha_{t-1}(2)$ as inputs and determines the log likelihoods $I\alpha_t(0)$ in state 0.

Similarly, the addition/comparison/selection circuits $47_1$ receives the log likelihoods $I\gamma_1[11]$, $I\gamma_t[00]$ and the log likelihoods $I\alpha_{t-1}(0)$, $I\alpha_{t-1}(2)$ as inputs and determines the log likelihood $I\alpha_t(1)$ in state 1.

Then, the addition/comparison/selection circuit $47_2$ receives the log likelihoods $I\gamma_t[10]$, $I\gamma_t[01]$ and the log likelihoods $I\alpha_{t-1}(1)$, $I\alpha_{t-1}(3)$ as inputs and determines the log likelihoods $I\alpha_t(2)$ in state 2.

Furthermore, the addition/comparison/selection circuits $47_3$ receives the log likelihoods $I\gamma_t[01]$, $I\gamma_t[10]$ and the log likelihoods $I\alpha_{t-1}(1)$, $I\alpha_{t-1}(3)$ as inputs and determines the log likelihood $I\alpha_t(3)$ in state 3.

In this way, the $I\alpha$ comparison circuit 43 performs the computation of the formula (27) and hence that of the formula (28) above, using the log likelihoods $I\gamma(\alpha)$ fed from the $I\gamma$ computation/storage circuit 32 and the initial value $I\alpha_0$ or the log likelihoods $I\alpha$ in the immediately preceding time slot held by the register 42, to determine the log likelihoods $I\alpha$ in each state in the next time slot. Then, the $I\alpha$ computation circuit 43 supplies the computed log likelihoods $I\alpha$ to the selector 41. The addition/comparison/selection circuits $47_0$, $47_1$, $47_2$ and $47_3$ will be described in greater detail hereinafter.

The RAMs 44, 45 sequentially stores the log likelihoods $I\alpha(0)$, $I\alpha(1)$, $I\alpha(2)$ and $I\alpha(3)$ fed from the register 42 under the control of the control signal $SC\alpha$ from the controller 31. If each of the log likelihoods $I\alpha(0)$, $I\alpha(1)$, $I\alpha(2)$ and $I\alpha(3)$ is expressed in 8 bits, the RAMs 44, 45 stores the log likelihoods $I\alpha(0)$, $I\alpha(1)$, $I\alpha(2)$ and $I\alpha(3)$ as a word of 32 bits. The log likelihoods $I\alpha(0)$, $I\alpha(1)$, $I\alpha(2)$ and $I\alpha(3)$ stored in the RAMs 44, 45 are then read out therefrom by selection circuit 46 in a predetermined sequence.

The selection circuit 46 selectively takes out the log likelihoods $I\alpha(0)$, $I\alpha(1)$, $I\alpha(2)$ or $I\alpha(3)$ that are read from the RAMs 44, 45 and supplies it to the soft-output computation circuit 35 as log likelihoods $I\alpha(\lambda)$ under the control of the control signal $SC\alpha$ from the controller 31.

Thus, the $I\alpha$ computation/storage circuit 33 initializes in a time slot immediately before the $I\gamma$ computation/storage circuit 32 starts outputting log likelihoods $I\gamma(\alpha)$ and causes the register 42 to hold the initial value $I\alpha_0$ selected by the selector 41. Then, in the subsequent clock cycles, the $I\alpha$ computation/storage circuit 33 causes the $I\alpha$ computation circuit 43 to sequentially compute the log likelihoods $I\alpha$ in the next time slot, using the log likelihoods $I\gamma(\alpha)$ fed from the $I\gamma$ computation/storage circuit 32 and the log likelihoods $I\alpha$ in the immediately preceding time slot fed from the register 42, and makes the register 42 store the log likelihoods $I\alpha$. Furthermore, the $I\alpha$ computation/storage 33 causes the RAMs 44, 45 to sequentially store the log likelihoods $I\alpha(0)$, $I\alpha(1)$, $I\alpha(2)$ and $I\alpha(3)$ in the respective states held in the register 42 and makes the selection circuit 46 to read them out in a predetermined sequence and supply them to the soft-output computation circuit 35 as log likelihoods $I\alpha(\lambda)$.

Figure 13:
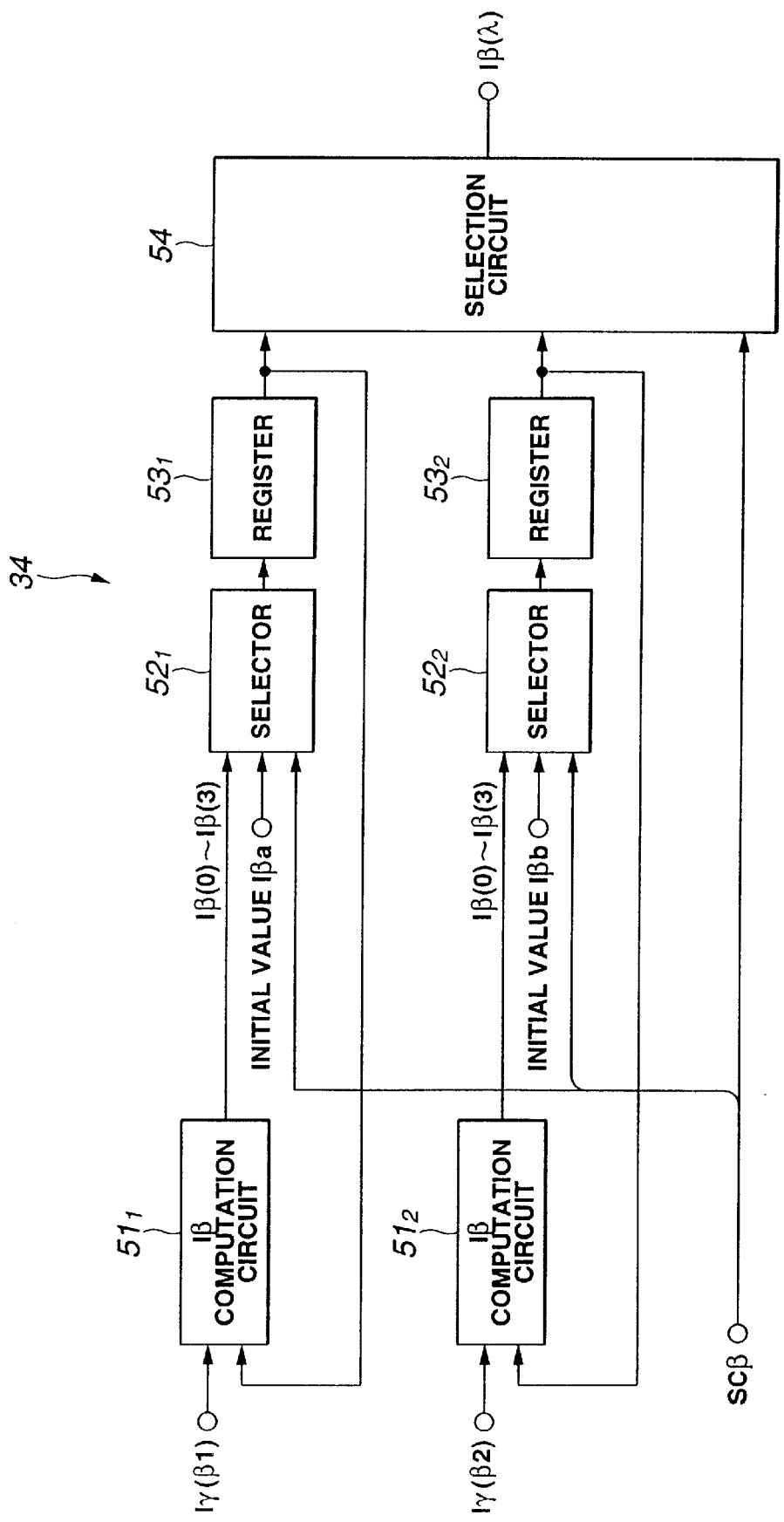
FIG. 13 is a schematic block diagram of the $I\beta$ computation/storage circuit of the decoder of FIG. 10, illustrating the circuit configuration.

Now, the $I\beta$ computation/storage circuit 34 will be described. As shown in FIG. 13, the $I\beta$ computation/storage circuit 34 comprises $I\beta$ computation circuits $51_1$, $51_2$ for computing the log likelihoods $I\beta$ in the states, selectors $52_1$, $52_2$ for selecting either the computed log likelihoods $I\beta$ or the initial values of the log likelihoods $I\beta a$, $I\beta b$, registers $53_1$, $53_2$ for holding the initial values $I\beta a$, $I\beta b$ or the log likelihoods $I\beta$ and a selection circuit 54 for selectively taking out one of the log likelihoods fed from the registers $53_1$, $53_2$.

Figure 14:
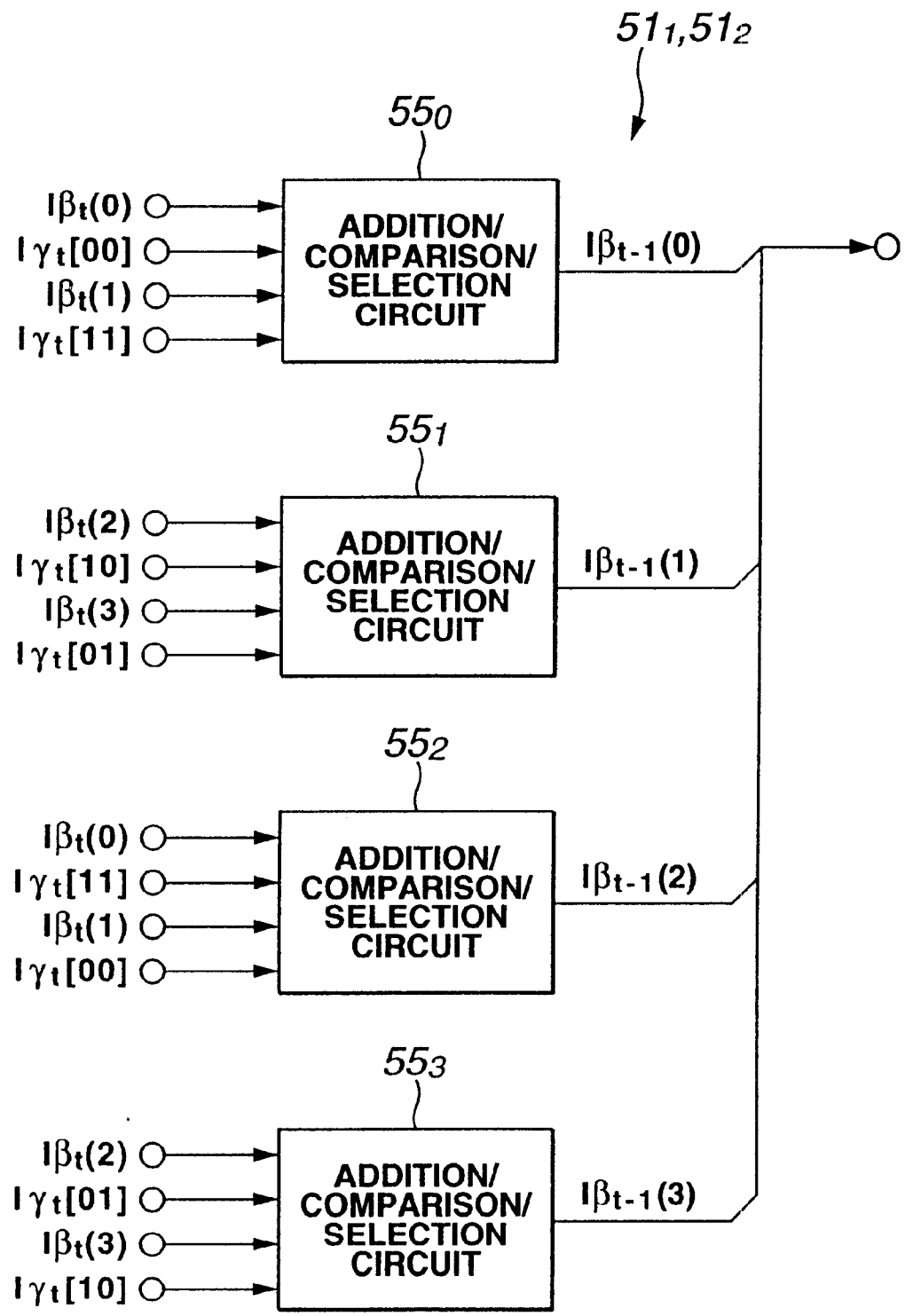
FIG. 14 is a schematic block diagram of the $I\beta$ computation circuit of the $I\beta$ computation/storage circuit of FIG. 13, illustrating the circuit configuration.

Referring now to FIG. 14, each of the $I\beta$ computation circuits $51_1$, $51_2$ comprises addition/comparison/selection circuits, the number of which corresponds to the number of states. In the above instance, each of the $I\beta$ computation circuits $51_1$, $51_2$ comprises four addition/comparison/selection circuits $55_0$, $55_1$, $55_2$ and $55_3$ as so many processing means.

Each of the addition/comparison/selection circuits $55_0$, $55_1$, $55_2$ and $55_3$ are fed with the log likelihoods $I\gamma_t[00]$, $I\gamma_t[10]$, $I\gamma_5[01]$, $I\gamma_5[11]$ of the branches corresponding to the respective outputs "00", "10", "01", "11" on the trellis as computed on the basis of the transitions on the trellis by the $I\gamma$ computation/storage circuit 32 and the log likelihoods $I\beta_t(0)$, $I\beta_t(1)$, $I\beta_t(2)$ and $I\beta_t(3)$ in all the states in the immediately preceding time slot. Then, each of the addition/comparison/selection circuits $55_0$, $55_1$, $55_2$ and $55_3$ determines the log likelihoods $I\beta$ in the immediately preceding time slot in state 0, state 1, state 2 and state 3.

More specifically, the addition/comparison/selection circuits $55_0$ receives the log likelihoods $I\gamma_t[00]$, $I\gamma_t[11]$ and the log likelihoods $I\beta_t(0)$, $I\beta_t(1)$ as inputs and determines the log likelihood $I\beta_{t-1}(0)$ in state 0.

Similarly, the addition/comparison/selection circuits $55_1$ receives the log likelihoods $I\gamma_t$ [10], $I\gamma_t$ [01] and the log likelihoods $I\beta_t$ (2), $I\beta_t$ (3) as inputs and determines the log likelihood $I\beta_{t-1}$ (1) in state 1.

Then, the addition/comparison/selection circuits $55_2$ receives the log likelihoods $I\gamma_t$ [11], $I\gamma_t$ [00] and the log likelihoods $I\beta_t$ (0), $I\beta_t$ (1) as inputs and determines the log likelihood $I\beta_{t-1}$ (2) in state 2.

Furthermore, the addition/comparison/selection circuits $55_3$ receives the log likelihoods $I\gamma_t$ [01], $I\gamma_t$ [10] and the log likelihoods $I\beta_t$ (2), $I\beta_t$ (3) as inputs and determines the log likelihood $I\beta_{t-1}$ (3) in state 3.

In this way, each of the $I\beta$ computation circuits $51_1$, $51_2$ performs the computation of the formula (29) and hence that of the formula (30) above, using the log likelihoods $I\gamma$ ($\beta 1$), $I\gamma$ ($\beta 2$) fed from the $I\gamma$ computation/storage circuit 32 and the initial values $I\beta a$, $I\beta b$ or the log likelihoods $I\beta$ held by the registers $53_1$, $53_2$, to determine the log likelihoods $I\beta$ in each state in the immediately preceding time slot. Each of the log likelihoods $I\beta$ (0), $I\beta$ (1), $I\beta$ (2), $I\beta$ (3) is expressed typically by 8 bits to make the total number of bits equal to 32. The $I\beta$ computation circuits $51_1$, $51_2$ respectively supply the computed log likelihoods $I\beta$ to the selectors $52_1$, $52_2$. The addition/comparison/selection circuits $55_0$, $55_1$, $55_2$ and $55_3$ will be described in greater detail hereinafter.

Each of the selectors $52_1$, $52_2$ selects the initial value of the log likelihood $I\beta a$ or $I\beta b$, whichever appropriate, at the time of initialization or the log likelihoods $I\beta$ fed from the $I\beta$ computation circuit $52_1$ or $52_2$, whichever appropriate, at any time except the time of initialization under the control of control signal $SC\beta$ fed from the controller 31. The initialization occurs in the time slot immediately before the $I\gamma$ computation/storage circuit 32 starts outputting log likelihoods $I\gamma$ ($\beta 1$), $I\gamma$ ($\beta 2$) and repeated in every cycle thereafter that is twice as long as the terminating length. While a same value such as 0 or log (1/M), or log (1/4) in this instance, is normally given as initial values $I\beta a$, $I\beta b$ for all the states, log $1=0$ is given as the value in the concluding state whereas log $0=-\infty$ is given in any other state when a concluded code is decoded. The selectors $52_1$, $52_2$ supplies respectively either the initial values $I\beta a$, $I\beta b$ or the log likelihoods $I\beta$ they select to the respective registers $53_1$, $53_2$.

The registers $53_1$, $53_2$ hold the initial values $I\beta a$, $I\beta b$ or the log likelihoods $I\beta$ supplied from the selectors $52_1$, $52_2$. Then, in the next time slot, the registers $53_1$, $53_2$ supply the initial values $I\beta a$, $I\beta b$ or the log likelihoods $I\beta$ they hold to the $I\beta$ computation circuits $51_1$, $51_2$ and the selection circuit 54.

The selection circuit 54 selectively takes out the log likelihoods $I\beta$ (0), $I\beta$ (1), $I\beta$ (2) or $I\beta$ (3) that are supplied from the registers $53_1$, $53_2$ and supplies it to the soft-output computation circuit 35 as log likelihood $I\beta$ ($\lambda$) under the control of the control signal $SC\beta$ from the controller 31.

Thus, the $I\beta$ computation/storage circuit 34 initializes in a time slot immediately before the $I\gamma$ computation/storage circuit 32 starts outputting log likelihoods $I\gamma$ ($\beta 1$) and in the subsequently cycle periods having a length twice as long as the terminating length and causes the register $53_1$ to hold the initial value $I\beta a$ selected by the selector $52_1$. Then, in the subsequent clock cycles, the $I\beta$ computation/storage circuit 34 causes the $I\beta$ computation circuit $51_1$ to sequentially compute the log likelihoods $I\beta$ in the immediately preceding time slot, using the log likelihoods $I\gamma$ ($\beta 1$) fed from the $I\gamma$ computation/storage circuit 32 and the log likelihoods $I\beta$ fed from the register $52_1$, and makes the register $53_1$ store the log likelihoods $I\beta$.

Furthermore, the $I\beta$ computation/storage circuit 34 initializes in a time slot immediately before the $I\gamma$ computation/ storage circuit 32 starts outputting log likelihoods $I\gamma$ ($\beta 2$) and in the subsequent cycle periods having a length twice as long as the terminating length and causes the register $53_2$ to hold the initial value $I\beta b$ selected by the selector $52_2$. Then, in the subsequent clock cycles, the $I\beta$ computation/storage circuit 34 causes the $I\beta$ computation circuit $51_2$ to sequentially compute the log likelihoods $I\beta$ in the immediately preceding time slot, using the log likelihoods $I\gamma$ ($\beta 2$) fed from the $I\gamma$ computation/storage circuit 32 and the log likelihoods $I\beta$ fed from the register $52_2$, and makes the register $53_2$ store the log likelihoods $I\beta$. Then, the $I\beta$ computation/storage circuit 34 causes the selection circuit 54 to read out the log likelihoods $I\beta$ (0), $I\beta$ (1), $I\beta$ (2) and $I\beta$ (3) in the respective states held in the registers $53_1$, $53_2$ in a predetermined sequence and supply them to the soft-output computation circuit 35 as log likelihoods $I\beta$ ($\lambda$).

Now, the addition/comparison/selection circuits $47_0$, $47_1$, $47_2$ and $47_3$ that the $I\alpha$ computation/storage circuit 33 comprises and the addition/comparison/selection circuits $55_0$, $55_1$, $55_2$ and $55_3$ that the $I\beta$ computation/storage circuit 34 comprises will be described below. However, since the addition/comparison/selection circuits $47_0$, $47_1$, $47_2$, $47_3$, $55_0$, $55_1$, $55_2$ and $55_3$ have a same and identical configuration and only differ from each other in term of inputs they receive and outputs they send out. Therefore, in the following description, they will be collectively referred to as addition/comparison/selection circuit 60. Furthermore, in the following description, the two log likelihoods $I\gamma$ input to each of the four addition/comparison/selection circuits $47_0$, $47_1$, $47_2$ and $47_3$ and the two log likelihoods $I\gamma$ input to each of the four addition/comparison/selection circuits $55_0$, $55_1$, $55_2$ and $55_3$ are denoted respective and collectively by IA and IB, whereas the two log likelihoods $I\alpha$ input to each of the four addition/comparison/selection circuits $47_0$, $47_1$, $47_2$ and $47_3$ and the two log likelihoods $I\beta$ input to each of the four addition/comparison/selection circuits $55_0$, $55_1$, $55_2$ and $55_3$ are denoted respectively and collectively by IC and ID. Furthermore, the log likelihoods $I\alpha$ output from each of the addition/comparison/selection circuits $47_0$, $47_1$, $47_2$ and $47_3$ and the log likelihoods $I\beta$ output from each of the addition/ comparison/selection circuits $55_0$, $55_1$, $55_2$ and $55_3$ are collectively denoted by IE.

Firstly, an addition/comparison/selection circuit 60 is adapted to shift the computed log likelihoods $I\alpha_t$, $I\beta_t$ by adding a predetermined value to the correction term of the Log-BCJR algorithm so as to make them show a unified symbol, be it negative or positive. In other words, the addition/comparison/selection circuit 60 is adapted to output only positive values or negative values for the computed log likelihoods $I\alpha_t$, $I\beta_t$. In the following description, any probability is expressed by a value not smaller than 0 and a lower probability is expressed by a larger value by taking situations where a decoder according to the invention is assembled as hardware.

Figure 15:
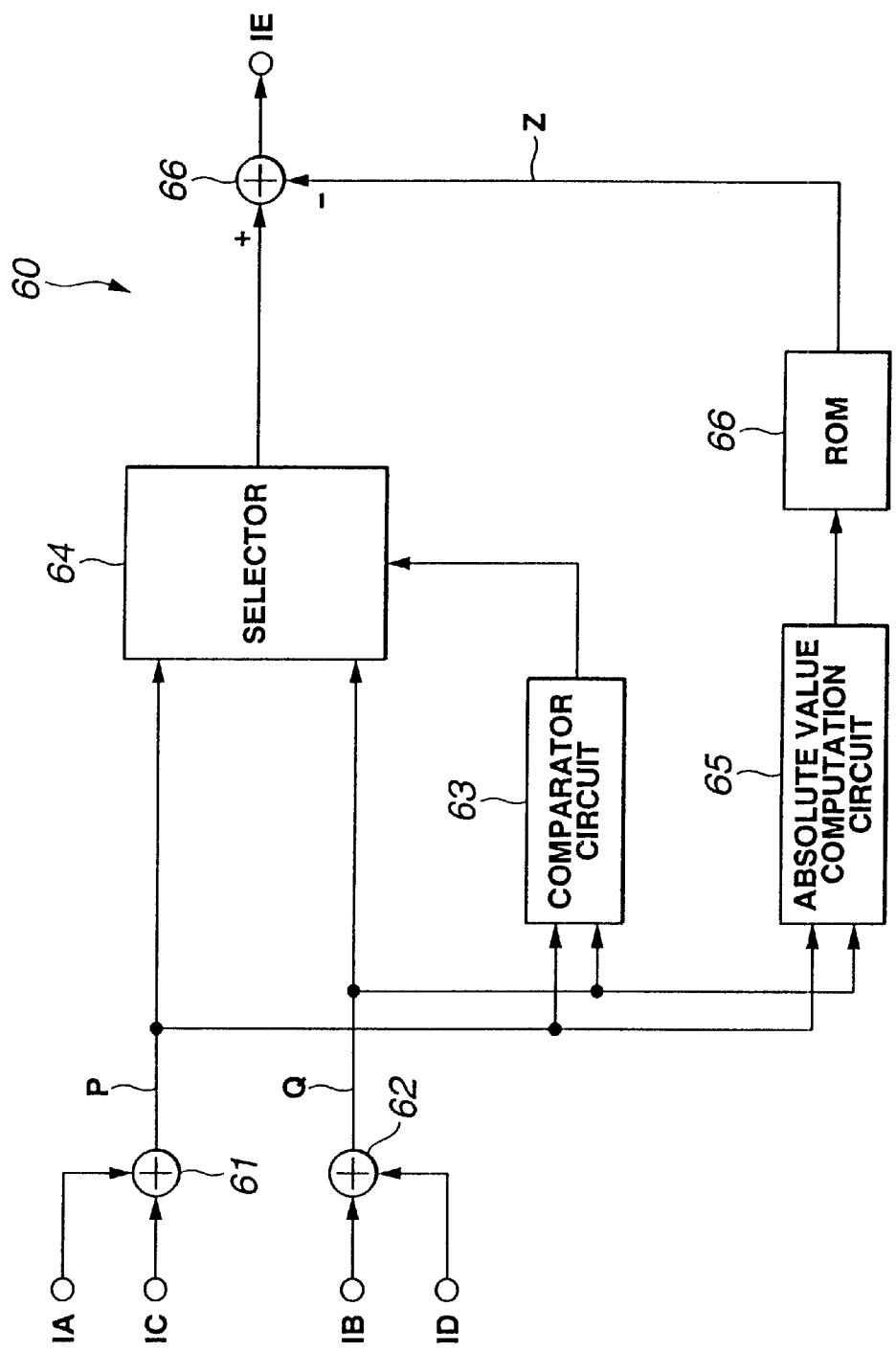
FIG. 15 is a schematic block diagram of the addition/comparison/selection circuit of the $I\alpha$ computation circuit or the $I\beta$ computation circuit.

As shown in FIG. 15, the addition/comparison/selection circuit 60 comprises adders 61, 62 for adding two data, comparator circuits 63 for comparing the outputs of the adders 61, 62 in terms of size, a selector 64 for selecting either one of the outputs of the adders 61, 62, an absolute value computation circuit 65 for computing the absolute value of the difference of data P fed form the adder 61 and data Q fed from the adder 62, a ROM (read only memory) 66 for storing the value of the correction term and a differentiators 67 for obtaining the difference of the two data.

The adder 61 is adapted to receive and add the log likelihoods IA, IC. If the addition/comparison/selection circuit 60 is the addition/comparison/selection circuit $47_0$, the adder 61 receives the log likelihood $I\gamma_t$ [00] and the log likelihood $I\alpha_{t-1}$ (0) as input and adds the log likelihood $I\gamma_t$ [00] and the log likelihood $I\alpha_{t-1}$ (0). The adder 61 then supplies the data obtained by the addition to the comparator circuit 63, the selector 64 and the absolute value computation circuit 65. Note that, in the following description, the data output from the adder 61 is denoted by P.

The adder 62 is adapted to receive and add the log likelihoods IB, ID. If the addition/comparison/selection circuit 60 is the addition/comparison/selection circuit $47_0$, the adder 62 receives the log likelihood $I\gamma_t$ [11] and the log likelihood $I\alpha_{t-1}$ (2) as input and adds the log likelihood $I\gamma_t$ [11] and the log likelihood $I\alpha_{t-1}$ (2). The adder 62 then supplies the data obtained by the addition to the comparator circuit 63, the selector 64 and the absolute value computation circuit 65. Note that, in the following description, the data output from the adder 62 is denoted by Q.

The comparator circuit 63 compares the value of the data P fed from the adder 61 and the value of the data Q fed from the adder 62 to see which is larger. Then, the comparator circuit 63 supplies the information on the comparison indicating the outcome of the comparison to the selector 64.

The selector 64 selects either the data P fed from the adder 61 or the data Q fed from the adder 62, whichever having a smaller value and hence showing a higher probability, on the basis of the information on the comparison supplied from the comparator circuit 63. Then, the selector 64 supplies the selected data to the differentiator 67. It will be appreciated that the data selected by the selector 64 is same and identical with the first term of the right side of the equation (28) and that of the equation (30) shown above.

The absolute value computation circuit 65 determines the absolute value of the difference of the data P fed from the adder 61 and the data Q fed from the adder 62. Then, the absolute value computation circuit 65 supplies the absolute value data |P−Q| on the obtained absolute value to the ROM 66.

The ROM 66 stores a table showing the relationship between the absolute value data |P−Q| that is the variable of a function and the value obtained by adding the second term and the third term of the right side of the equation (28) or (30). The ROM 66 also turns the absolute value data |P−Q| fed from the absolute value computation circuit 65 into a reading address signal so that the value corresponding to the absolute value data |P−Q| is read out as data Z by the differentiator 67.

The differentiator 67 determines the difference of the data selected by the selector 64 and the data Z read out from the ROM 66 and outputs the difference as log likelihood IE. If the addition/comparison/selection circuit 60 is the addition/comparison/selection circuit $47_0$, the differentiator 67 outputs the log likelihood $I\alpha_1$ (0).

Upon receiving the log likelihoods IA, IB, IC, ID as inputs, the addition/comparison/selection circuit 60 performs the operation of the equation (28) or the equation (30) shown above to determine log likelihood IE and then outputs the obtained log likelihood IE. More specifically, as the value obtained by adding constant δ to the value of the correction term for the absolute value data |P−Q| is stored in the ROM 66 in advance, the addition/comparison/selection circuit 60 can compute the log likelihood IE by shifting the log likelihood computed by the ordinary Log-BCJR algorithm by constant δ. It is desirable that the constant δ is equal to the value of the second term of the equation (28) or that of the equation (30) when P=Q, or δ=log 2 (the value of natural logarithm for 2), or a value defined by δ>log 2.

Figure 16:
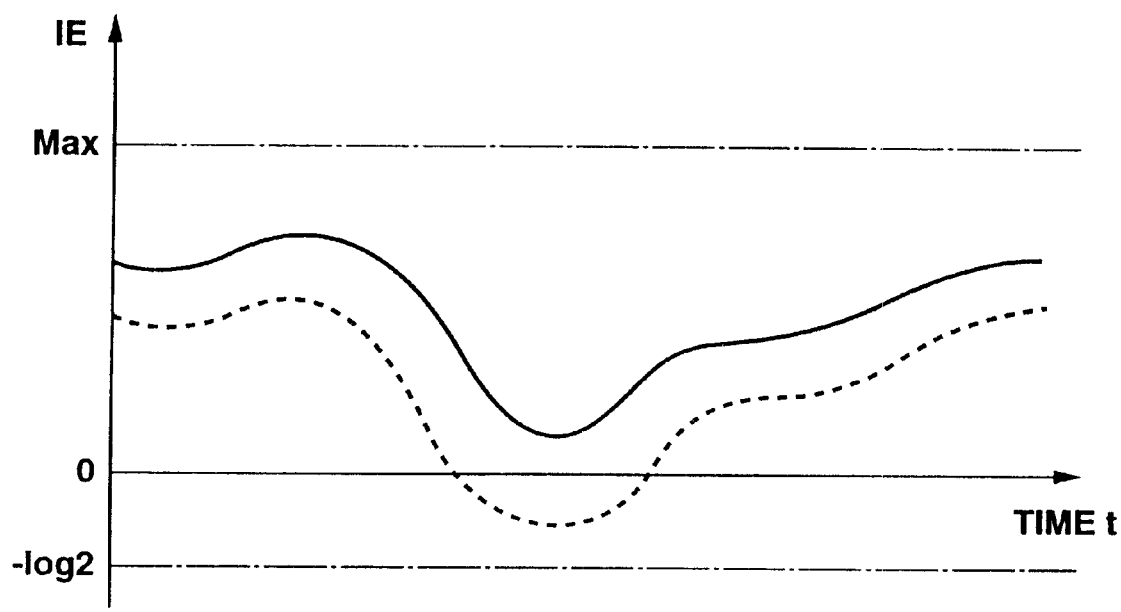
FIG. 16 is a graph schematically illustrating a computed log likelihood.

This is because that the log likelihood computed by means of the ordinary Log-BCJR algorithm or obtained by omitting the third term of the equation (28) or that of the equation (30) above can be found within a predetermined range as indicated by dotted broken lines in FIG. 16 that covers both the positive side and the negative side with the minimum value of −log 2. Thus, the addition/comparison/selection 60 adds a constant δ that is expressed by δ=log 2 or δ>log 2 to the correction term in order to shift the log likelihood in the positive direction so that the obtained log likelihood IE will take only positive values as indicated by the curve of a solid cline in FIG. 16. In FIG. 16, Max denotes the maximum value of the log likelihood IE, which is expressed by max (IA+IC, IB+ID) output from the selector 64.

As described above, the addition/comparison/selection 60 adds constant δ to the value of the correction term in order to shift the computed log likelihood and obtain log likelihood IE that always takes a positive value. Thus, the addition/comparison/selection 60 is only required to handle only positive values smaller than max (IA+IC, IB+ID) so that it may not give rise to any trouble to the decoded output and hence reduce the number of bits necessary for expressing the outcome of each series of computing operations of the decoder.

Thus, in the above described data transmission/reception system comprising the encoder 1 and the decoder 3, the decoder 3 is adapted to adds a predetermined value to the value of the correction term in the operation of performing a log-sum correction to consequently reduce the number of bits required to express the outcome of each series of computing operations it performs so that the dimension of the circuit can be reduced without sacrificing the performance of the system.

Thus, a data transmission/reception system comprising an encoder 1 and a decoder 3 and adapted to operate in a manner as described above can decode convolutional codes highly effectively with a small circuit dimension to provide the user with an enhanced level of reliability and convenience.

The present invention is by no means limited to the above described embodiment. For instance, the encoder may not be adapted to convolutional operations and may operate for encoding with any coding ratio.

For instance, if the encoder is adapted to perform convolutional operations with a coding ratio expressed by "2/n", the trellis of the encoder shows a structure where four paths get to a state in the next time slot from each state. Then, while the decoder is required to carry out at least twice the above described log-sum operation for computing the log likelihoods $I\alpha_t$, $I\beta_t$, it only needs to add constant δ to the correction term in each log-sum operation.

Therefore, the present invention is applicable to an encoder operating with any coding ratio.

While the above described embodiment is adapted to turn all the computed log likelihoods into positive values. According to the present invention, it is also possible to obtain log likelihoods showing negative values and express lower probabilities in smaller values. If such is the case, the constant δ to be added to the correction term will be δ=−log 2 or δ<−log 2. Thus, the present invention is applicable to arrangements where the computed log likelihoods are shifted in the negative direction to make show only negative values. Generally, it is only necessary to add a value expressed by δ≧|log 2| to the correction term.

Figure 17:
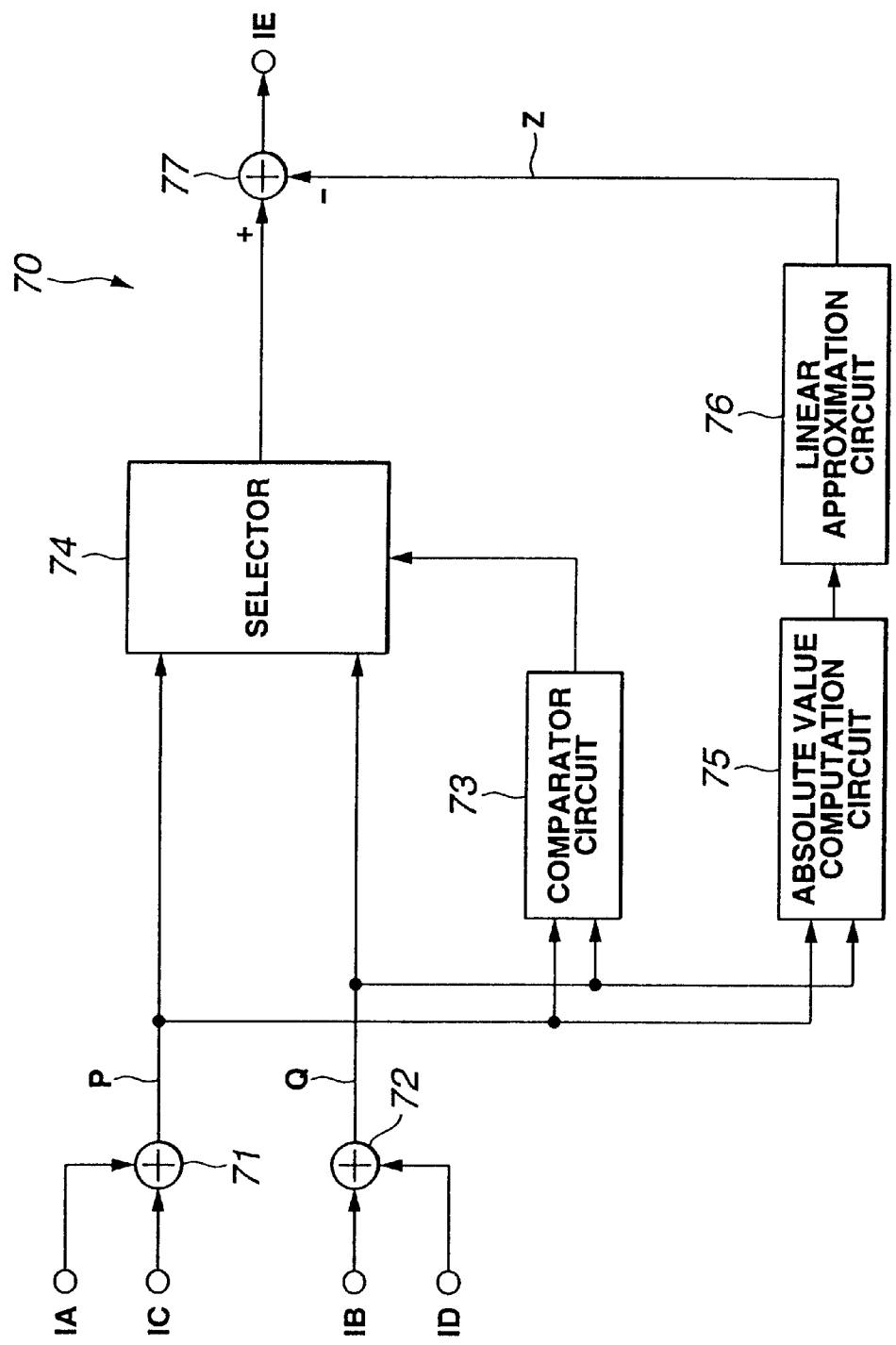
FIG. 17 is a schematic block diagram of an addition/comparison/selection circuit different from that of FIG. 15.

Additionally, while the addition of a predetermined value to the correction term is performed by referring to the table stored in the ROM in the above embodiment, the present invention is also applicable to arrangements where a predetermined value is added to the correction term that is computed by means of linear approximation or threshold approximation. As an example, an addition/comparison/selection circuit adapted to corrections by means of linear approximation will be discussed by referring to FIG. 17. In FIG. 17, the components of the addition/comparison/selection circuit that are the same as those of the addition/comparison/selection circuit 60 will be denoted respectively by the same reference symbols and will not be described any further.

The addition/comparison/selection circuit 70 shown in FIG. 17 comprises two adders 71, 72, a comparator circuit 73, a selector 74 and an absolute value computation circuit 75, which correspond respectively to the adders 61, 62, the comparator circuit 63, the selector 64 and the absolute value computation circuit 65 of the above described addition/comparison/selection circuit 60, along with a linear approximation circuit 76 operating as linear approximation means for computing the value of the correction term by linear approximation and a differentiator 77 that also corresponds to the above described differentiator 67.

The linear approximation circuit 76 computes the value of the correction term by linear approximation using the absolute value obtained by the absolute value computation circuit 75 and adds a predetermined value to the value of the correction term. More specifically, the linear approximation circuit 76 expresses the correction term by means of a one-dimensional function for variable $|P-Q|$ so as to linearly approximate it by means of the function $-a|P-Q|+b$, where coefficient $-a$ ($a>0$) denotes the ingredient of the function and coefficient $b$ denotes the intercept of the function, and ultimately computes the value of $-a|P-Q|+b+\delta=-a|P-Q|+\epsilon$, an expression showing that constant $\delta$ is added to the correction term. Then, the linear approximation circuit 76 supplies the data Z obtained as a result of the above computation to the differentiator 77.

Thus, as in the case of the addition/comparison/selection circuit 60, upon receiving the log likelihoods IA, IB, IC, ID as inputs, the addition/comparison/selection circuit 70 carries out the operation of the above formula (28) of (30) to obtain the log likelihood IE, which is then output from the circuit 70. In other words, when computing the correction term for the absolute value data $|P-Q|$, the addition/comparison/selection circuit 70 adds the constant $\delta$ to the correction term so that it can determine the log likelihood IE that represents a value obtained by shifting the log likelihood as computed by the ordinary Log-BCJR algorithm by the constant $\delta$.

In this way, the present invention can be applied not only to an arrangement where the operation of adding a predetermined value to the correction term is performed by referring to a table stored in a ROM but also to an arrangement where the correction term is computed by linear approximation or some other means.

Additionally, the present invention is applicable to any arrangement for decoding codes formed by concatenating a plurality element codes such as parallel concatenated convolutional codes, series concatenated convolutional codes, codes of a Turbo-coding modulation system or codes of a series concatenated coding modulation system.

While the encoder and the decoder of the above described embodiment are applied respectively to the transmitter and the receiver of a data transmission/reception system, the present invention can also be applied to a recording and/or reproduction device adapted to recording data to and/or reproducing data from a recording medium such as a magnetic, optical or magneto-optical disk, which may be a floppy disk, a CD-ROM or a MO (magneto-optical) disk. Then, the data encoded by the encoder are recorded on a recording medium that is equivalent to a memoryless communication channel and then decoded and reproduced by the decoder.

Thus, the above described embodiment can be modified and/or altered appropriately without departing from the scope of the invention.

What is claimed is:

1. A decoder for determining the log likelihood logarithmically expressing the probability of passing a given state on the basis of the received value regarded as soft-input and decoding the input by using the log likelihood, said decoder comprising:

a processing means for adding a correction term and a predetermined value to the log likelihood, in order to obtain a corrected log likelihood, the correction term being expressed in a one-dimensional function relative to a variable, so that the corrected log likelihoods uniformly have positive values or negative values.

2. The decoder according to claim 1, wherein said processing means comprises a memory means for storing the relationship of said variable and the value obtained by adding said correction term and said predetermined value; and the value obtained by adding said correction term and said predetermined value is read out from said memory means as address signal for reading said variable.

3. The decoder according to claim 1, wherein said processing means comprises a linear approximation means for linearly approximating said correction term and adding said predetermined value to said correction term.

4. The decoder according to claim 1, wherein said predetermined value is expressed by means of a natural logarithmic value of 2.

5. The decoder according to claim 1, wherein said log likelihood logarithmically expresses said probability by means of natural logarithm.

6. The decoder according to claim 1, further comprising:

a first probability computing means for computing for each received value a first log likelihood logarithmically expressing a first probability determined by the code output pattern and said received value;

a second probability computing means for computing for each received value a second log likelihood logarithmically expressing a second probability of getting to each state from a coding starting state in the time series;

a third probability computing means for computing for each received value a third log likelihood logarithmically expressing a third probability of getting to each state from a coding terminating state in the inverted time series; and said second probability computing means and said third probability computing means having said processing means.

7. The decoder according to claim 6, further comprising:

a soft-output determining means for determining a log soft-output logarithmically expressing the soft-output in each time slot by using said first log likelihood, said second log likelihood and said third log likelihood.

8. The decoder according to claim 7, wherein said log soft-output is a logarithmic expression of said soft-output, using the natural logarithm.

9. The decoder according to claim 1, wherein said log likelihood is determined by computations replacing the multiplications for computing the probability by logarithmic additions and the additions for computing the probability by logarithmic maximum value computations and computations of said function.

10. The decoder according to claim 9, wherein a maximum a posteriori probability decoding operation is conducted on the basis of the Log-BCJR algorithm.

11. The decoder according to claim 1, wherein convolutional codes are decoded.

12. A decoding method for determining the log likelihood logarithmically expressing the probability of passing a given state on the basis of the received value regarded as soft-input and decoding the input by using the log likelihood, said decoding method comprising:

a processing step for adding a correction term and a predetermined value to the log likelihood, in order to obtain a corrected log likelihood, the correction term being expressed in a one-dimensional function relative to a variable, so that the corrected log likelihoods uniformly have positive values or negative values.

13. The decoding method according to claim 12, wherein said processing step is adapted to storing the relationship of said variable and a value obtained by adding said correction term and said predetermined value; and the value obtained by adding said correction term and said predetermined value is read out as address signal for reading said variable.

14. The decoding method according to claim 12, wherein said processing step is adapted to linearly approximating said correction term and adding said predetermined value to said correction term.

15. The decoding method according to claim 12, wherein said predetermined value is expressed by means of a natural logarithmic value of 2.

16. The decoding method according to claim 12, wherein said log likelihood logarithmically expresses said probability by means of natural logarithm.

17. The decoding method according to claim 12, further comprising:

a first probability computing step for computing for each received value a first log likelihood logarithmically expressing a first probability determined by a code output pattern and said received value;

a second probability computing step for computing for each received value a second log likelihood logarithmically expressing a second probability of getting to each state from a coding starting state in the time series;

a third probability computing step for computing for each received value a third log likelihood logarithmically expressing a third probability of getting to each state from a coding terminating state in the inverted time series; and said second probability computing step and said third probability computing step having processing steps same as the one defined in claim 12 respectively.

18. The decoding method according to claim 17, further comprising:

a soft-output determining step for determining a log soft-output logarithmically expressing the soft-output in each time slot by using said first log likelihood, said second log likelihood and said third log likelihood.

19. The decoding method according to claim 18, wherein said log soft-output is a logarithmic expression of said soft-output by means of the natural logarithm.

20. The decoding method according to claim 12, wherein said log likelihood is determined by computations replacing the multiplications for computing the probability by logarithmic additions and the additions for computing the probability by logarithmic maximum value computations and computations of said function.

21. The decoding method according to claim 20, wherein a maximum a posteriori probability decoding operation is conducted on the basis of the Log-BCJR algorithm.

22. The decoding method according to claim 12, wherein convolutional codes are decoded.

* * * * *